(12) United States Patent
Kang

(10) Patent No.: US 9,773,840 B2
(45) Date of Patent: Sep. 26, 2017

(54) SEMICONDUCTOR MEMORY WITH REDUCED CONTACT MARGIN

(71) Applicant: SK hynix Inc., Icheon-Si (KR)

(72) Inventor: Hee-Sung Kang, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 310 days.

(21) Appl. No.: 14/604,647

(22) Filed: Jan. 23, 2015

(65) Prior Publication Data

US 2015/0249111 A1 Sep. 3, 2015

(30) Foreign Application Priority Data

Feb. 28, 2014 (KR) .......................... 10-2014-0024071

(51) Int. Cl.
| | |
|---|---|
| G11C 7/18 | (2006.01) |
| H01L 27/24 | (2006.01) |
| G11C 11/16 | (2006.01) |
| G11C 13/00 | (2006.01) |
| G06F 13/16 | (2006.01) |
| H01L 27/22 | (2006.01) |

(52) U.S. Cl.
CPC ...... *H01L 27/2436* (2013.01); *G06F 13/1694* (2013.01); *G11C 7/18* (2013.01); *G11C 11/1659* (2013.01); *G11C 13/0002* (2013.01); *G11C 13/003* (2013.01); *G11C 2213/79* (2013.01); *G11C 2213/82* (2013.01); *H01L 27/228* (2013.01)

(58) Field of Classification Search
CPC .............................. G11C 7/18; H01L 27/2436
See application file for complete search history.

(56) References Cited

U.S. PATENT DOCUMENTS

| 7,106,650 B2* | 9/2006 | Choi | ........................ | G11C 7/18 |
| | | | | 365/230.03 |
| 7,426,129 B2* | 9/2008 | Choi | ........................ | G11C 7/18 |
| | | | | 365/185.05 |
| 7,974,114 B2* | 7/2011 | Nirschl | .................. | G11C 5/063 |
| | | | | 365/51 |
| 8,614,908 B2* | 12/2013 | Lee | ........................ | G11C 7/065 |
| | | | | 365/205 |

(Continued)

FOREIGN PATENT DOCUMENTS

| KR | 101033468 B1 | 4/2011 |
| KR | 1020140118143 A | 10/2014 |

*Primary Examiner* — Evan Pert
(74) *Attorney, Agent, or Firm* — Perkins Coie LLP

(57) ABSTRACT

An electronic device is provided to comprise a semiconductor memory unit that comprises: a substrate including active regions, which are extended in a second direction and disposed from each other in a first direction; a plurality of gates extended in the first direction and across with the active regions; a lower contact disposed in both sides of gates and coupling the active regions in the first direction; an upper contact of the lower contact overlapping with the active region out of the active regions in a side of each gate, and overlapping with the active regions in the other side of each gate; and first and second interconnection lines coupled to the upper contact, extended in the second direction, and being alternately disposed from each other in the first direction, wherein the upper contact of a side of the gates has a zigzag shape in a first oblique direction.

19 Claims, 18 Drawing Sheets

(56) References Cited

U.S. PATENT DOCUMENTS

| | | | | |
|---|---|---|---|---|
| 8,976,567 B2 * | 3/2015 | Kim | ................. | G11C 7/00 |
| | | | | 365/148 |
| 9,147,442 B2 * | 9/2015 | Yi | ................. | G11C 13/0028 |
| 9,520,187 B2 * | 12/2016 | Yi | ................. | H01L 27/2463 |

* cited by examiner

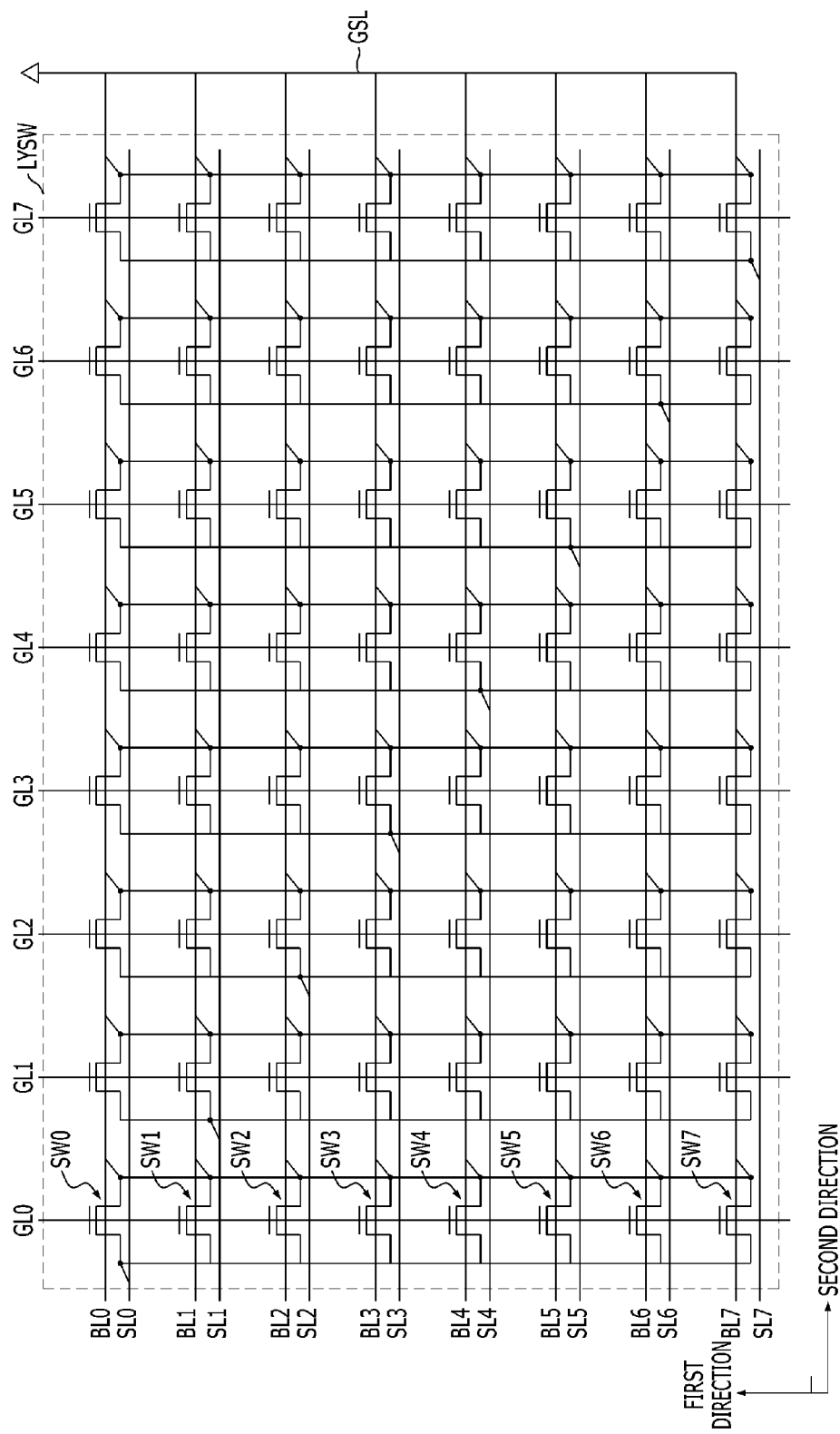

SEMICONDUCTOR MEMORY WITH REDUCED CONTACT MARGIN

CROSS-REFERENCE TO RELATED APPLICATIONS

This patent document claims priority of Korean Patent Application No. 10-2014-0024071, entitled "ELECTRONIC DEVICE" and filed on Feb. 28, 2014, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for semiconductor devices capable of storing information in various electronic devices or appliances such as a computer, a portable communication device, and so on. Research and development for such electronic devices or appliances have been conducted. Examples of such semiconductor devices or appliances include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems. Various implementations of an electronic device include a semiconductor memory with an improved contact margin to reduce area size, a resistance and a manufacturing cost and simplify a manufacturing process.

In one aspect, an electronic device is provided to include a semiconductor memory unit that includes: a substrate including a plurality of active regions, which are extended in a second direction and disposed from each other in a first direction across with the second direction; a plurality of gates extended in the first direction and across with the plurality of active regions; a lower contact disposed in both sides of the plurality of gates and coupling the plurality of active regions in the first direction; an upper contact of the lower contact overlapping with the active region out of the plurality of active regions in a side of each of the plurality of gates, and overlapping with the plurality of active regions in the other side of each of the plurality of gates; and a plurality of first and second interconnection lines coupled to the upper contact, extended in the second direction, and being alternately disposed from each other in the first direction, wherein the upper contact of a side of the gates has a zigzag shape in a first oblique direction.

In some implementations, the upper contact disposed in a side of an $N_{th}$ gate in the second direction may overlap with an $(N-1)_{th}$ or $(N+1)_{th}$ active region in the first direction, where N is a natural number. In some implementations, when the N is an odd number, the upper contact disposed in a side of the $N_{th}$ gate in the second direction overlaps with the $(N+1)_{th}$ active region in the first direction, and when the N is an even number, the upper contact disposed in the side of the $N_{th}$ gate in the second direction may overlap with the $(N-1)_{th}$ active region in the first direction. In some implementations, when the N is an odd number, the upper contact of a side of the gates may be disposed in both sides of the upper contact of the other side of the gates, which is disposed in the other side of the $N_{th}$ gate in the second direction and overlaps with the $N_{th}$ active region in the first direction, in a second oblique direction across with the first oblique direction. In some implementations, a maxim value of the N may be the number of the active regions, which is coupled by the lower contact. In some implementations, the upper contact of the side of the gates may have a contact area larger than a contact area of the other side of the gates. In some implementations, the upper contact of a side of the gates and the first interconnection line may be disposed in a side of the active region in the first direction, and the upper contact of the other side of the gates and the second interconnection line may be disposed in the other side of the active region in the first direction. In some implementations, the semiconductor memory unit may further include a separation gate disposed between the gates in the second direction, extended in the first direction and across with the plurality of active regions. In some implementations, the separation gate and the gates may be alternately disposed in the second direction. In some implementations, the upper contact of the side of the gates and the upper contact of the other side of the gates may be alternately disposed in the first oblique direction. In some implementations, two regions where the upper contact of the side of the gates and the upper contact of the other side of the gates are alternately disposed in the first oblique direction may be disposed in parallel. In some implementations, the separation gate and two gates may be alternately disposed in the second direction. In some implementations, the upper contact of the other side of the gates may be disposed between the two gates and the upper contact of the side of the gates may be disposed between the gates and the separation gate. In some implementations, two regions where the upper contact of the side of the gates and the upper contact of the other side of the gates may be alternately disposed in the first oblique direction are disposed in parallel. In some implementations, the lower contact may have a bar shape, which is extended to contact with the plurality of active regions in the first direction. In some implementations, the lower contact may have a plurality of groups, each having 2n number of active regions, where n is a natural number, and the lower contact has a bar shape, which is extended to contact with all of the active regions within each groups in the first direction. In some implementations, the upper contact of the other side of the gates and the upper contact of the side of the gates may be alternately disposed in a second oblique direction across from the first oblique direction. In some implementations, the electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that is part of the cache memory unit in the processor. In some implementations, the electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit is part of the auxiliary memory device or the main memory device in the processing system. In some implementations, the electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit is part of the storage device or the temporary storage device in the data storage system. In some implementations, the electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit is part of the memory unit in the microprocessor. In some implementations, The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that is part of the memory or the buffer memory in the memory system.

In another aspect, an electronic device is provided to include a semiconductor memory unit that includes: a plurality of memory cells; a mat region having N number of first interconnection lines coupled to terminals of the plurality of memory cells; and a switching region for controlling a coupling between each of the N number of first interconnection lines and an external region, the switching region comprises: a substrate having N number of second active regions, which are extended in a second direction and are from each other in a first direction across from the second direction; N number of second gates extended in the first direction and across from the N number of second active regions; a second lower contact disposed in both sides of each of the N number of second gates and coupling the N number of second active regions in the first direction; a second upper contact overlapping with a corresponding second active regions out of the N number of second active regions in a side of each of the N number second gates, and disposed to have a zigzag shape in a first oblique direction; a third upper contact overlapping with each of the N number of second active regions in the other side of each of the N number of second gates; N number of second interconnection lines coupled to the second upper contact, extended in the second direction, and coupled to each of the N number of first interconnection lines; and N number of third interconnection lines coupled to the third upper contact, extended in the second direction, and coupled to the external region, where N is a natural number.

In some implementations, the mat region may include: N number of first active regions formed in the substrate, extended in the second direction and disposed from each other in the first direction; N number of first gates extended in the first direction and across from the N number of first active regions; a stacked structure having a first lower contact, a variable resistance element and a first upper contact, and disposed in the N number of first active regions of a side of the N number of first gates; interconnection line contacts disposed in the N number of first active regions of the other side of the N number of first gates; the N number of first interconnection lines coupled to one of the stacked structure and the interconnection line contacts and extended in the second direction; and a fourth interconnection line coupled to the other one of the stacked structure and the interconnection line contacts and extended in the second direction. In some implementations, the variable resistance element may include a magnetic tunnel junction having a tunnel barrier interposed between two magnetic layers. In some implementations, the variable resistance element may include a metal oxide, a phase change material or a ferroelectric material. In some implementations, the second upper contact disposed in a side of the $M_{th}$ second gate in the second direction may overlap with $(M-1)_{th}$ or $(M+1)_{th}$ second active region in the first direction, where M is a natural number. In some implementations, when M is an odd number, the second upper contact disposed in the side of the $M_{th}$ second gate in the second direction may overlap with $(M+1)_{th}$ second active region in the first direction, and when M is an even number, the second upper contact disposed in the side of the $M_{th}$ second gate in the second direction may overlap with $(M-1)_{th}$ second active region in the first direction. In some implementations, when M is an odd number, the second upper contact may be disposed in both sides of the third upper contact, which is disposed in the other side of the $M_{th}$ second gate in the second direction and may overlap with $M_{th}$ second active region in the first direction, in a second oblique direction across from the first oblique direction. In some implementations, a maximum value of M may be the number of the second active regions coupled by the second lower contact. In some implementations, the second upper contact has a contact area larger than a contact area of the third upper contact. In some implementations, the second upper contact and the second interconnection lines may be disposed in a side of the second active regions in the first direction, and the third upper contact and the third interconnection lines are disposed in the other side of the second active regions in the first direction. In some implementations, the semiconductor memory unit that may further include: a third gate disposed between the second gates in the second direction, extended in the first direction and across from the N number of second active regions. In some implementations, the third gate and the second gates may be alternatively disposed in the second direction. In some implementations, the second upper contact and two third upper contacts may be alternately disposed in the third oblique direction. In some implementations, two regions where the second upper contact and two third upper contacts may be alternately disposed in the first oblique direction are disposed in parallel. In some implementations, the third gate and two second gates may be alternately disposed in the second direction. In some implementations, the third upper contact may be interposed between two second gates, and the second upper contact may be interposed between the second gate and the third gate. In some implementations, two regions where the second upper contact and the third upper contact are alternately disposed in the first oblique direction may be disposed in a parallel. In some implementations, the second lower contact may have a bar shape extended to contact with all the N number of second active regions in the first direction. In some implementations, the second lower contact may have a plurality of groups, each having 2n number of active regions, where n is a natural number, and the second lower contact has a bar shape, which is extended to contact with all of the second active regions within each groups in the first direction. In some implementations, the third upper contact and the second upper contact may be alternately disposed in a second oblique direction across from the first oblique direction.

BRIEF DESCRIPTION OF THE DRAWINGS

FIG. 6B is an equivalent circuit of a switching region shown in FIG. 6A.

DETAILED DESCRIPTION

Figure 1:
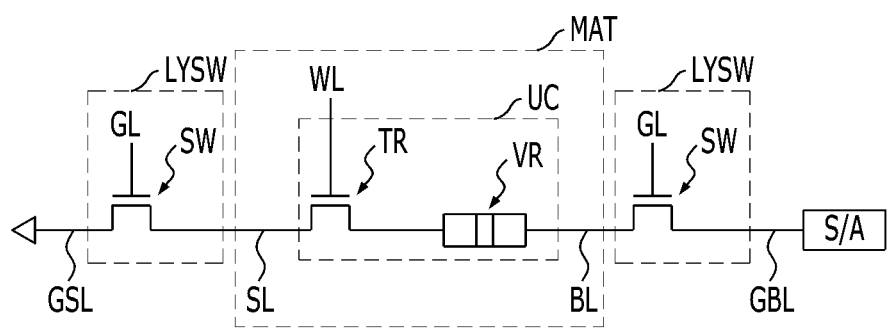
FIG. 1 is a block diagram illustrating a memory cell of an exemplary semiconductor memory device and a configuration of a memory cell in accordance with an implementation of the present disclosure.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1 is a block diagram illustrating an exemplary memory cell of a semiconductor memory device and a configuration of a memory cell in accordance with an implementation of the present disclosure.

Referring to FIG. 1, a memory cell UC may include a variable resistance element VR and a selection element, e.g., a selection transistor TR. The variable resistance element VR is switched between different resistance state according to a voltage or a current applied to both ends of the variable resistance element VR. The selection transistor TR is coupled to one end of the variable resistance element VR and selects one of a plurality of variable resistance elements VR.

The memory cell UC may store data using a variable resistance characteristic of the variable resistance element VR. For example, if the variable resistance element VR is in a low resistance state, the data having a value of '0' may be stored, and if the variable resistance element VR is in a high resistance state, the data having a value of '1' may be stored. The variable resistance element VR may be a single layer or a multi layer including a material used in a RRAM, PRAM, STTRAM, MRAM and/or FRAM, e.g., a ferromagnetic material, a ferroelectric material, a phase change material such as a chalcogenide material, a metal oxide such as a perovskite material, and/or a transition metal oxide. For example, if the variable resistance element VR is used as a magnetic resistance element in the STTRAM or the MRAM, the variable resistance element VR may include a tunnel barrier disposed between two magnetic layers.

Both ends of the memory cell UC may be coupled to a bit line BL and a source line SL, respectively. For example, one end of the variable resistance element VR is coupled to the bit line BL. One end of the selection transistor TR is coupled to the source line SL. A gate of the selection transistor TR is coupled to a word line WL.

The source line SL may be coupled to a predetermined interconnection line via a global source line GSL. A bit line BL may be coupled to a sense amplifier S/A for amplifying data of the memory cell via the global bit line GSL. The data of the variable resistance element VR is provided to the bit line BL and is transferred to the sense amplifier S/A via a predetermined path. A switching transistor SW for controlling a connection may be disposed between the source line SL and the global source line GSL and between the bit line BL and the global bit line GBL. A gate of the switching transistor SW may be coupled to a gate line GL.

A plurality of memory cells may be disposed in a mat region MAT. The switching transistor SW may be disposed on a switching region LYSW on a side of the mat region MAT. In one implementation, the plurality of memory cells may form various type arrays. For example, a plurality of bit lines BL, a plurality of source lines SL and a plurality of word lines WL may be disposed on the mat region MAT. As the plurality of source lines SL and the plurality of bit lines BL are disposed on the mat region MAT, a plurality of switching regions SW corresponding to the plurality of source lines SL and the plurality of bit lines BL may be disposed on the switching region LYSW. For example, the plurality of switching transistors SW for controlling a connection between the plurality of source lines SL and the global source line GSL may be disposed on the switching region LYSW on one side, for example, a left side of the mat region MAT. The plurality of switching transistor SW for controlling the connection between the plurality of bit lines BL and the global source line GSL may be disposed on the switching region LYSW on another side, for example, a right side of the mat region MAT. The disposition of the mat region MAT and the switching region LYSW will be described with reference to FIG. 2.

Figure 2:
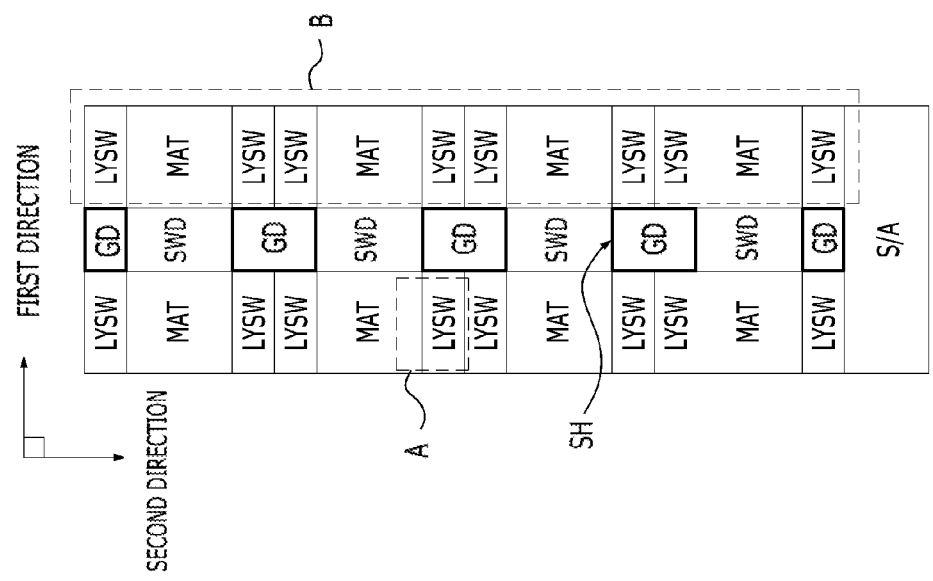
FIG. 2 is a diagram illustrating an exemplary disposition of a semiconductor memory device in accordance with an implementation of the present disclosure.

FIG. 2 is a diagram illustrating an exemplary disposition of a semiconductor memory device in accordance with an implementation of the present disclosure.

Referring to FIG. 2, a semiconductor memory device may include a plurality of mat regions MAT. The mat region MAT may be arranged with a matrix type along a first direction and a second direction. In one implementation of the present disclosure, eight mat regions MAT of 2×4 is exemplarily arranged, but other implementations are also possible regarding the number of mat regions MAT without being limited to the eight mat regions MAT. That is, the arrangement and the number of the mat regions MAT can be varied.

A word line driver SWD for controlling a plurality of word lines WL may be disposed around an adjacent MAT region, for example, on a side of the adjacent MAT region along the first direction. For example, the word line driver SWD may be disposed between two adjacent mat regions. Although not shown, a plurality of word lines WL disposed on each of the plurality of mat regions MAT may be extended in the second direction and coupled to the corresponding word lines driver SWD.

The switching region LYSW may be disposed around an adjacent MAT region, on a side of the adjacent MAT region along the second direction. For example, the switching transistor SW for coupling the source line SL of the mat region MAT to the global source line GSL may be disposed on the switching region LYSW that is located on a side of the adjacent MAT region along the second direction. The switching transistor SW for coupling the bit line BL of the mat region MAT to the global bit line GBL may be disposed on the switching region LYSW that is located on the other side of the adjacent MAT region along the second direction. Although not shown, a plurality of source lines SL disposed on the plurality of mat regions MAT may be extended in the second direction and coupled to the switching region LYSW on a side of the adjacent MAT region along the second direction. The plurality of bit lines BLS may be extended in the second direction and coupled to the switching region LYSW on the other side the adjacent MAT region along the second direction.

According to the arrangement including the mat region MAT, the switching region LYSW, and the word line driver SWD, a vacant space may be provided. For example, the vacant space may be provided between the two switching regions LYSW that are arranged in the first direction and between the two word line drivers SWD that are arranged in the second direction. The vacant space is referred to as a sub-hole region SH. A gate driver GD for controlling a gate line GL of the switching transistor SW disposed on the switching region LYSW may be disposed in the sub-hole region SH. Although not shown, the gate line GL of the switching transistor SW may be extended in the first direction and be coupled to the gate drive GD. Although, not shown, the global bit line GBL may cross the mat region MAT and the switching region LYSW, which are arranged in the second direction, and be coupled to a sense amplifier S/A. Although not shown, the global source line GSL may cross the mat region MAT and the switch region LYSW, which are arranged in the second direction, and be coupled to an interconnection line.

In the above-mentioned semiconductor memory device, the switching region LYSW needs to have a minimum resistance. If a resistance of elements coupled to the switching transistor SW is great, a sensing margin of the sense amplifier S/A is decreased or an operation voltage is increased.

Hereinafter, an exemplary switching region LYSW will be described in details.

Figure 3:
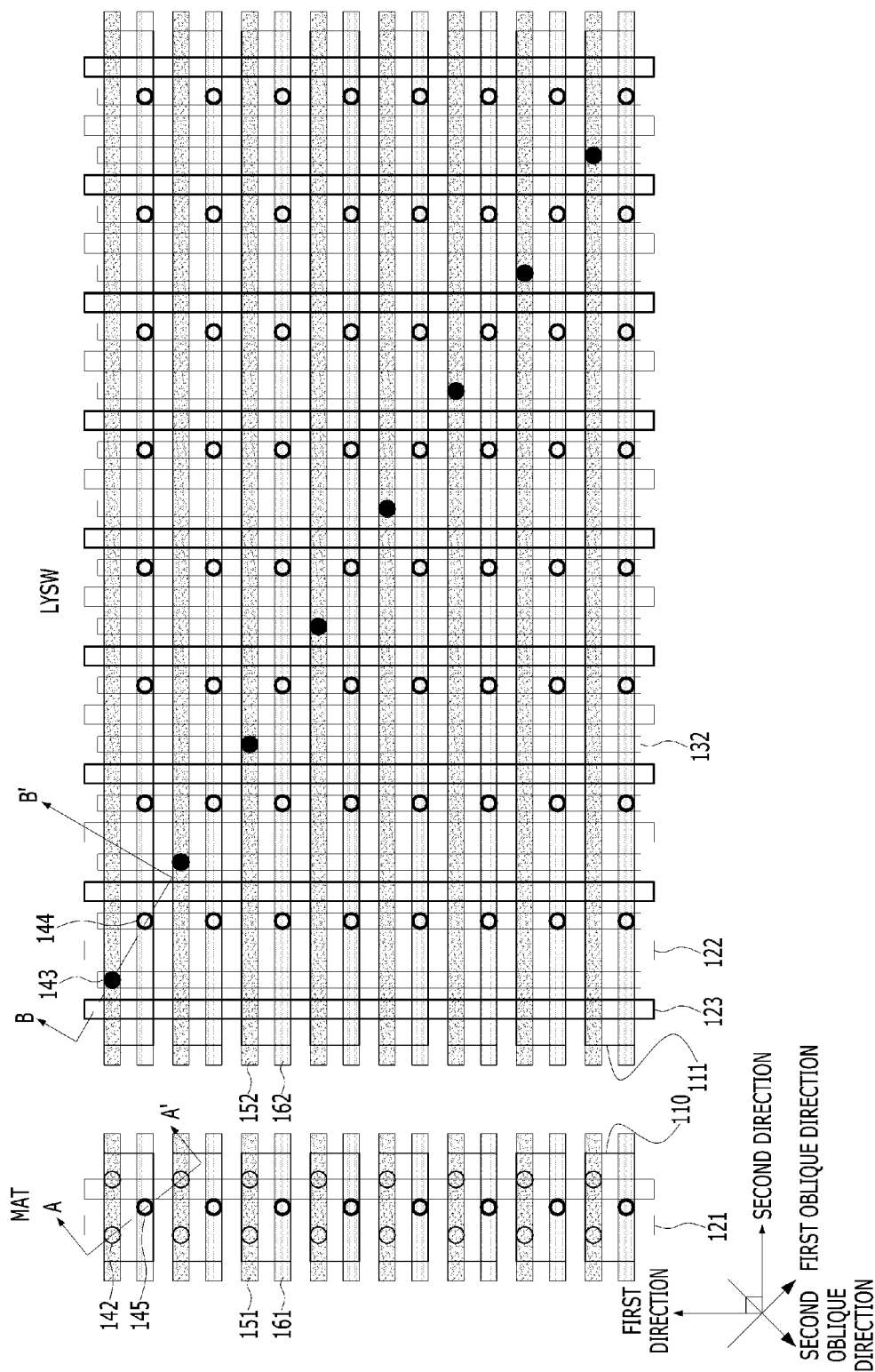
FIG. 3 is an exemplary plane diagram illustrating a semiconductor memory device in accordance with a first implementation of the present disclosure.
Figure 4:
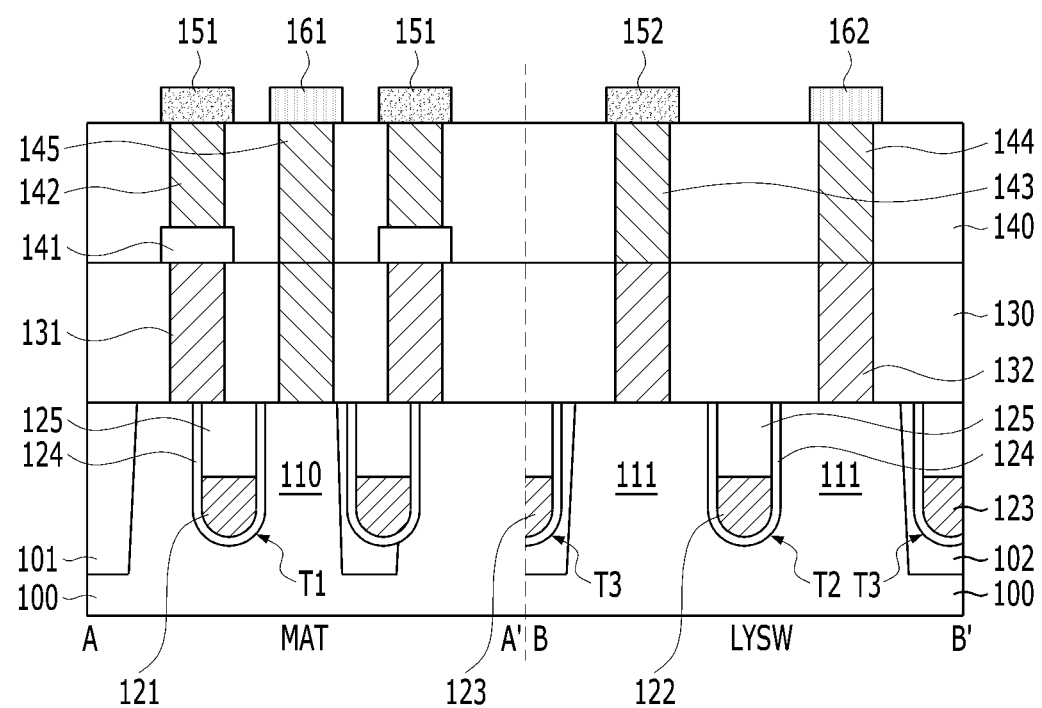
FIG. 4 is a cross-sectional view along A-A' dotted line and B-B' dotted line shown in FIG. 3.

FIG. 3 is an exemplary plane diagram illustrating a semiconductor memory device in accordance with a first implementation of the present disclosure. FIG. 3 shows 'A' region shown in FIG. 2. For the convenience of the descriptions, a portion of the switching region having a switching transistor and a portion of mat region having a plurality of memory cells are shown. FIG. 4 is a cross-sectional view along A-A' dotted line and B-B' dotted line shown in FIG. 3.

Referring to FIGS. 3 and 4, in the semiconductor memory device in accordance with the first implementation of the present disclosure, N number of first active regions 110 may be disposed in a mat region MAT, and N number of second active regions 111 may be disposed in a switching region LYSW, where N is a natural number. For example, N is 8 in the first implementation of the present disclosure.

A plurality of first gates 121, which cross the first active region 110, may be disposed in the mat region MAT. The first gate 121 may be buried in a substrate 100. A stacked structure having a first lower contact 131, a variable resistance element 141 and a first upper contact 142 may be disposed on the first active region 110, e.g., a first drain, on a side of the first gate 121. A source line contact 145 may be disposed on the first active region 110, e.g., a first source, on the other side of the first gate 121. A first bit line 151 and a first source line 161, which are extended in a second direction, may be disposed on the first upper contact 142 and the source line contact 145, respectively. Herein, the stacked structure having the first lower contact 131, the variable resistance element 141 and the first upper contact 142 may be disposed on the first active region 110 as far away as possible from the source line contact 145 in the first direction. A margin between the first bit line 151 and the first source line 161 can be obtained.

A plurality of memory cells including a selection transistor coupled to a first gate 121 and the variable resistance element 141 coupled to a terminal of the selection transistor may be disposed on the mat region MAT. Both ends of each of the memory cells may be coupled the first bit line 151 and the first source line 161.

N number of second gates 122, e.g., 8 second gates, which cross the second active region 111 may be disposed on the switching region LYSW. The second gate 122 may have a similar shape as the first gate 121, and be buried in the substrate 100. For example, if 8 second gates 122 are disposed on the switching region LYSW, since each second gate 122 is coupled to 8 switching transistors, for example, through gates of 8 switching transistors, 64 switching transistors may be disposed on the switching region LYSW. Second drains of 8 switching transistors coupled to the same second gate 122 may be coupled to each other through a second lower contact 132 on one side, for example, left side of the corresponding second gate 122, and be coupled to the corresponding second bit line 152 through a second upper contact 143 of the second gates 122. Second sources of 8 switching transistors coupled to the same second gate 122 may be coupled to each other through a second lower contact 132 on another side, for example, right side of the corresponding second gate 122 and be coupled to the corresponding second source line 162 through a third upper contact 144.

Hereinafter, configuration of the semiconductor memory device in accordance with a first implementation of the present disclosure will be described as below in details.

The semiconductor memory device in accordance with the first implementation of the present disclosure may include a mat region MAT, a switching region LYSW, a substrate 100, a first element isolation layer 101 and a second element isolation layer 102. A well region is formed on the substrate 100. The first element isolation layer 101 is formed on the mat region MAT of the substrate 100 and defines a first active region 110. The second element isolation layer 102 is formed on the switching region LYSW of the substrate 100 and defines a second active region 111. N number of active regions 110 may be disposed on the mat region MAT. N number of second active regions 111 may be disposed on the switching region LYSW. In the first implementation of the present disclosure, N is eight, but N is not limited to eight and may be changed to other numbers.

The first element isolation layer 101 and the second element isolation layer 102 may be formed through a shallow trench isolation (STI) process, and may include an insulation material. The first active region 110 may be extended in a second direction. A plurality of first active regions 110 may be disposed apart from each other in a first direction. The number of first active regions 110 may be same as the number of first bit lines 151 disposed on the mat region MAT. The second active regions 111 are disposed around, for example, on a side of the first active region 110, and may be extended in the second direction. The number of second active regions 111 may be same as the number of the first active regions 110. The first active regions 110 may have a one-to-one correspondence with the second active regions.

The semiconductor memory device in accordance with the first implementation of the present disclosure may include a first trench T1, a second trench T2, a third trench T3, a gate insulation layer 124, first to third gates 121 to 123, a gate protection layer and a junction. The first trench T1 is formed in the substrate 100. The gate insulation layer 124 is formed on the first to third trenches T1 to T3. The first to third gates 121 to 123 partially bury the first to third trenches T1 to T3 on the gate insulation layer 124. The gate protection layer 125 buries other parts of the first to third trenches T1 to T3 on the first to third gates 121 to 123. The junction including a source and a drain is formed in a first active region 110 and a second active region 111 except the gate protection layer 125.

The first gate 121 may be functioned as a gate of a selection transistor on a mat region MAT. A second gate 122 may be functioned as a gate of a switching transistor on a switching region LYSW. The third gate 123 may be functioned as a gate for isolating the switching transistors from one another, which are arranged in a second direction on the switching region LYSW. The first to third trenches T1 to T3 formed in the substrate 100 may have a line shape in the first direction. The first to third gates 121 to 123 may be extended in the first direction and cross the first active region 110 and the second active region 111. In one implementation, the first to third gates 121 to 123 may be buried in the substrate 100. In other implementations of the present disclosure, the first to third gates 121 to 123 may be formed on the substrate 100, or may be formed such that portions of the first to third gates 121 123 are buried in the substrate 100 and other portions of the first to third gates 121 to 123 protrude from the substrate 100.

The depths of the first element isolation layer 101 and the second element isolation layer 102 are greater than those of the first to third trenches T1 to T3 in the first active region 110 and the second active region 111. The first active region 110 and the second active region 111 may protrude over or from the first element isolation layer 101 and the second element isolation layer 102 in bottom portions of the first to third trenches T1 to T3. The first active region 110 and the second active region 111 may have a fin-type. In this case, the first to third gates 121 to 123 can improve a current driving capacity of the selection transistor and the switching transistor by surrounding the upper sides and sides of the first active region 110 and the second active region 111, which protrude more than the first and second element isolation layers 101 and 102 from the first direction.

The second gate 122 serves as a gate of the switching transistor. The number of the second gate 122 to be formed may be determined according to the number of a first bit line 151 to be disposed in the mat region MAT. In one implementation, the number of second gates 122 may be N as same as the number of first bit lines 151 to be disposed in the mat region MAT. The second gates 122 has a one-to-one correspondence with the first bit lines 151 in the mat region MAT and may control data transmission through the first bit lines 151. However, the number of second gates 122 are not limited to be same as the number of first bit lines 151 and other implementations are also possible. In another implementation of the present disclosure, the number of second gates may be decreased as $\frac{1}{2}^n$ of the number of first bit lines 151 in the mat region MAT based on size or number of the second active regions 111 coupled by a second lower contact 132, where n is a natural number.

In the first implementation of the present disclosure, the third gate 123 is disposed between the second gates 122, but other implementations are also possible on the arrangement of the third gate 123. In another implementation of the present disclosure, the third gate 123 may be omitted or disposed between a plurality of second gates. For example, as described in FIGS. 11 and 12, a third gate 123 may be disposed between two second gates 122.

The number of first gates 121 may be varied irrespective of the number of first bit lines 151 in the mat region MAT. As described above, FIG. 3 shows 'A' portion shown in FIG. 2, and shows a part of the mat region MAT. Thus, for the convenience of the descriptions, two first gates 121 are shown, but various numbers of first gates can be included in implementations of the present disclosure.

For the convenience of descriptions regarding a junction formed in the first active region 110 and the second active region 111, junctions at both sides of the first gate 121 are referred to as a first source and a first drain, respectively, and junctions at both sides of the second gate 122 are referred to as a second source and a second drain, respectively. Herein, a right side junction of the second gate 122 is referred to as the second source and a left side junction of the second gate 122 is referred to as the second drain. Two selection transistors, which are adjacent to each other in a second direction, may share the first source. A plurality of selection transistors including the first source and the first drain at both sides of the first gate 121 and coupled to a first gate 121 may be disposed in the mat region MAT. A plurality of switching transistors including the second source and the second drain at both sides of the second gate 122 and coupled to a second gate 122 may be disposed in the switching region LYSW. The switching transistors of the switching region LYSW may be isolated by the third gate 123 in the second direction, and be isolated by the second element isolation layer 102 in the first direction.

The semiconductor memory device in accordance with the first implementation of the present disclosure may include a first interlayer insulation layer 130, a first lower contact 131 and a second lower contact 132. The first interlayer insulation layer 130 is formed on the substrate 130. The first lower contact 131 penetrates through the first interlayer insulation layer 130 and is coupled to the first active region 110 at a side of the first gate 121. The second lower contact 132 penetrates through the first interlayer insulation layer 130 of the switching region LYSW and is coupled to the second active region 111 at a side of the second gate 122.

The first lower contact 131 is disposed under lower part of the variable resistance element 141, and couples the variable resistance element 141 to a junction of the first gate 121. The first lower contact 131 may have a island shape or a hole shape, and be disposed to be coupled to the first active region, e.g., the first drain, at a side of the first gate 121 other than a space between the two first gates 121. The first lower contact 131 may be disposed close to one side, for example, the upper side, of the first active region in the first direction to secure a margin between the first lower contact 131 and a source line contact 145. If the first bit line 151 and the first source line 161 are formed in the same layer of the mat region MAT, a margin between the first bit line 151 and the first source line 161 can be secured.

The second lower contact 132 may be disposed on both sides of the second gate 122. The second lower contact 132 may have a bar shape or a line shape extending in the first direction such that a plurality of second active regions 111, which are disposed on left and right sides of the second gate 122 in the first direction, are coupled to each other. The second lower contact 132 enables the second drains of the plurality of switching transistors disposed in the first direction to be coupled to from one another, and the second sources of the plurality of switching transistors to be coupled from one another.

The semiconductor memory device in accordance with the first implementation of the present disclosure may include the variable resistance element 141. The variable resistance element 141 is formed on the first interlayer insulation layer 130 and is electrically coupled to the first lower contact 131. The variable resistance element 141 is disposed between the first lower contact 131 and the first upper contact 142, and is switched between different resistance states according to a voltage or a current applied through the first lower contact 131 and the first upper contact 142. Thus, the variable resistance element 141 may include a variable resistance material used in a resistive memory in which the storing and removing of information is performed by a change of a resistance characteristic. The variable resistance element 141 may have a single layer or a multi-layer including a material, which is used in RRAM, PRAM, STTRAM, MRAM, or FRAM and etc, e.g., a transition metal oxide, a metal oxide such as a perovskite material, a phase change material such as a chalcogenide material, a ferroelectric material or a ferromagnetic material. For example, if the variable resistance element 141 is or includes a magnetic tunnel junction (MTJ) used in the STTRAM or MRAM, the variable resistance element may have a tunnel barrier inserted between two magnetic layers.

The semiconductor memory device in accordance with the first implementation of the present disclosure may include a second interlayer insulation layer 140, a first upper contact 142, a source line contact 145, a second upper contact 143 and a third upper contact 144. The second interlayer insulation layer 140 is formed on the first interlayer insulation layer 130 and covers the variable resistance layer 141.

The first upper contact 142 penetrates the second interlayer insulation layer 140 in the mat region MAT and is electrically coupled to the variable resistance element 141. More specifically, the first upper contact 142 is disposed on or over an upper part of the variable resistance element 141 and couples the variable resistance element 141 to the first bit line 141. The first upper contact 142 may have an island shape or a hole shape. Since the first upper contact 142 may overlap with the variable resistance element 141 and the first lower contact 131, only the first upper contact 142 is shown in FIG. 3.

The source line contact 145 penetrates the second interlayer insulation layer 140 and the first interlayer insulation layer 130 in the mat region MAT and is coupled to the first active region 110 of the other side of the first gate 121. More specifically, the source line contact 145 couples a junction at the other side of the first gate 121 to the first source line 161. The source line contact 145 may have an island shape or a hole shape, and may be disposed to be coupled to the first active region 110 between two first gates 121, e.g., the first source. The source line contact 145 may be disposed on one side, for example, the lower side of the first active region 110 in the first direction. Thus, an interval margin between the source line contact 145 and the first lower contact 131 can be secured. If the first source line 161 and the first bit line 151 in the mat region MAT are formed at the same layer, the interval between the first source line 161 and the first bit line 151 can be secured.

The second upper contact 143 and the third upper contact 144 penetrate the second interlayer insulation layer 140 in the switching region LYSW and are coupled to a side of the second gate 122 and the other side of the second lower contact 132, respectively. For example, the second upper contact 143 may be disposed to overlap with a corresponding second bit line 152 among the second bit lines 152 disposed in the second direction. The second upper contact may be disposed to overlap with a corresponding second active region 111 among the second active regions 111 disposed in the first direction. The interconnection between the second upper contact 143 and the second bit line 152 may be same as the interconnection between the second upper contact 143 and the second active region 111. Herein, the second bit line 152 corresponding to the second upper contact 143 may be determined depending on the position of the second gate 122. For example, as shown in drawings, a $N_{th}$ (where N is any natural number between 1 and 8) second gate from left corresponds to a $N_{th}$ second bit line 152 from top. A maximum number of N may be decided as a number of the second active regions 111 coupled by the second lower contact 132. Thus, the second upper contact 143 on the left side of the $N_{th}$ second gate 122 may overlap with $N_{th}$ second bit line 152 from top. Meanwhile, the third upper contact 144 may overlap with the second active region 111 disposed in the first direction. Thus, the second upper contact 143 and the third upper contact 144 may be alternately disposed in a first oblique direction where some of the plurality of second upper contacts 143 and some of the plurality of third upper contacts 144 are slanted at a predetermined degree from the first direction or the second direction. One second upper contact 143 may be disposed at the center of the third upper contacts 144, which are disposed in a second oblique direction crossing the first oblique direction. The second upper contacts 143 and the third upper contacts 144 may have an island shape or a hole shape to secure an interval margin between the second upper contacts 143 and the third upper contacts 144. A plane shape of the second upper contacts 143 and the third upper contacts 144 may be or include a circle shape or a square shape. Herein, an area of the second upper contacts 143 may be the same as an area of the third upper contacts 144. The second upper contact 143 may be disposed close to one side, for example, the upper side, and the third upper contact 144 may be disposed close to another side, for example, the lower side to secure the interval margin between the second upper contact 143 and the third upper contact 144. If the second source line 162 and the second bit line 152 that are included in the switching region LYSW are disposed at the same layer, the interval margin between the second source line 162 and the second bit line 152 can be secured.

The semiconductor memory device in accordance with the first implementation of the present disclosure may include the first bit line 151, the first source line 161, the second bit line 152 and the second source line 162. The first bit line 151 and the first source line 161 are formed on the second interlayer insulation layer 140, and coupled to the first upper contact 142 and the source line contact 145, respectively. The first bit line 151 and the first source line 161 are extended in the second direction. The second bit line 152 and the second source line 162 are formed on the second interlayer insulation layer 140 and coupled to the second upper contact 143 and the third upper contact 144, respectively. The second bit line 152 and the second source line 162 are extended in the second direction. A pair of the first bit line 151 and the first source line 161 may be disposed at each first active region 110 in the mat region MAT, and a pair of the second bit line 152 and the second source line 162 may be disposed at each second active region 111 in the switching region LYSW.

Although not shown in drawings, the first bit line 151 may be coupled to the corresponding second bit line 152 directly or indirectly, for example, through a conducting pattern. If the first bit line 151 is directly coupled to the corresponding second bit line 152, an extended bit line is formed in the second direction across the mat region MAT and the switching region LYSW. The first source line 161 and the second source line 162 are not coupled to each other.

The first bit line 151 in the mat region MAT functions to transfer data of the variable resistance element 141. The first source line 161 is coupled to a terminal of the selection transistor and provides a predetermined bias voltage to the selection transistor. The second bit line 152 and the second source line 162 in the switching region LYSW which correspond to the first bit line 151 and the first source line 161 in the mat region MAT, respectively, are referred to as a bit line and a source line. The second bit line 152 and the second source line 162 perform functions different from those that are performed by the bit line and the source line in the mat region. For example, the second bit line 152 in the switching region LYSW which is coupled the first bit line 151 corresponding to the second bit line 152 receives data from the first bit line 151. With the control of the switching transistor, the second source line 162 transfers data, transferred to any one of the second bit lines 152, to the outside, e.g., a sense amplifier S/A. This will be described in details with reference to FIGS. 5A and 5B, which show an equivalent circuit of a switching region LYSW and data flow.

Figure 5A:
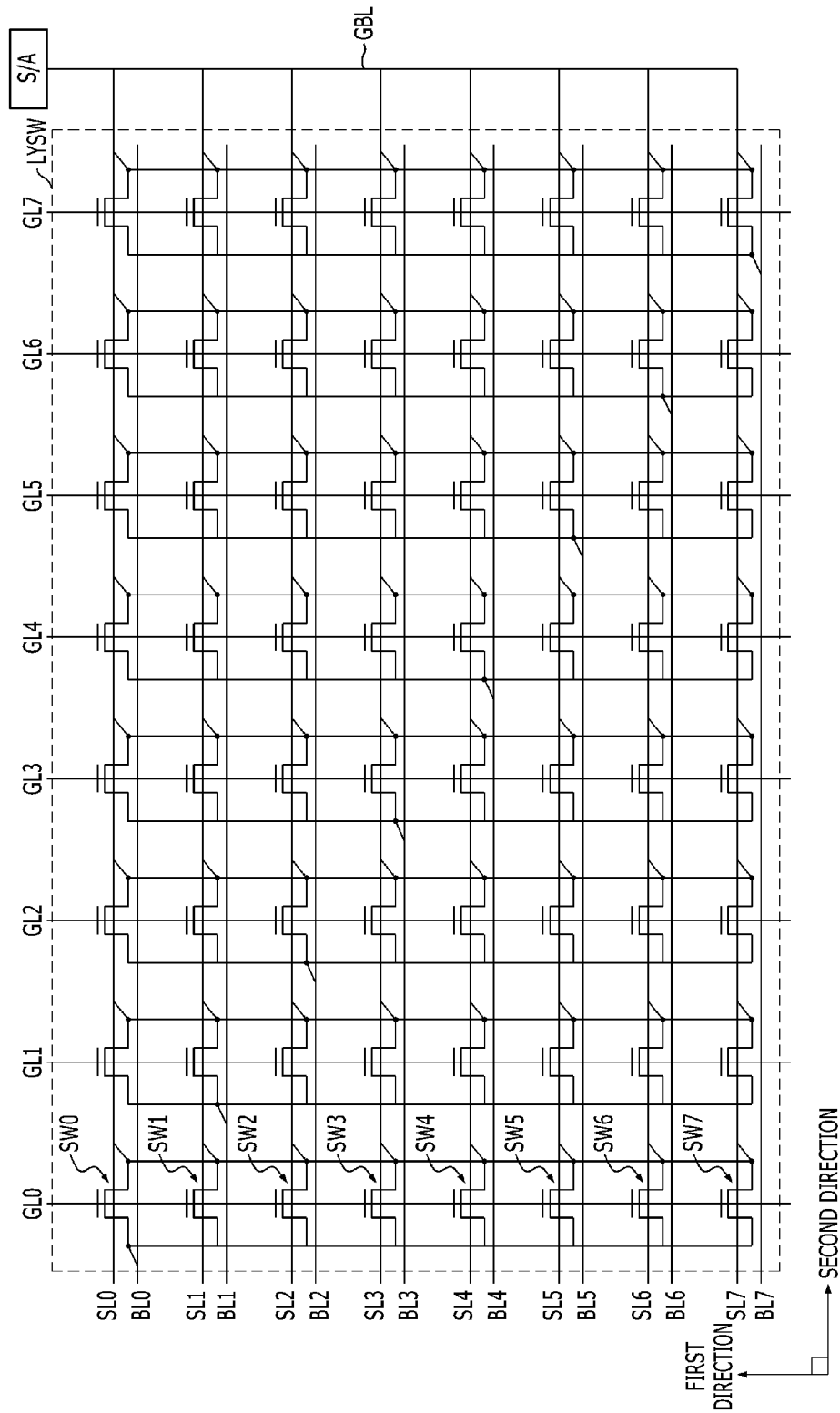
FIG. 5A is an equivalent circuit of a switching region shown in FIG. 4.
Figure 5B:
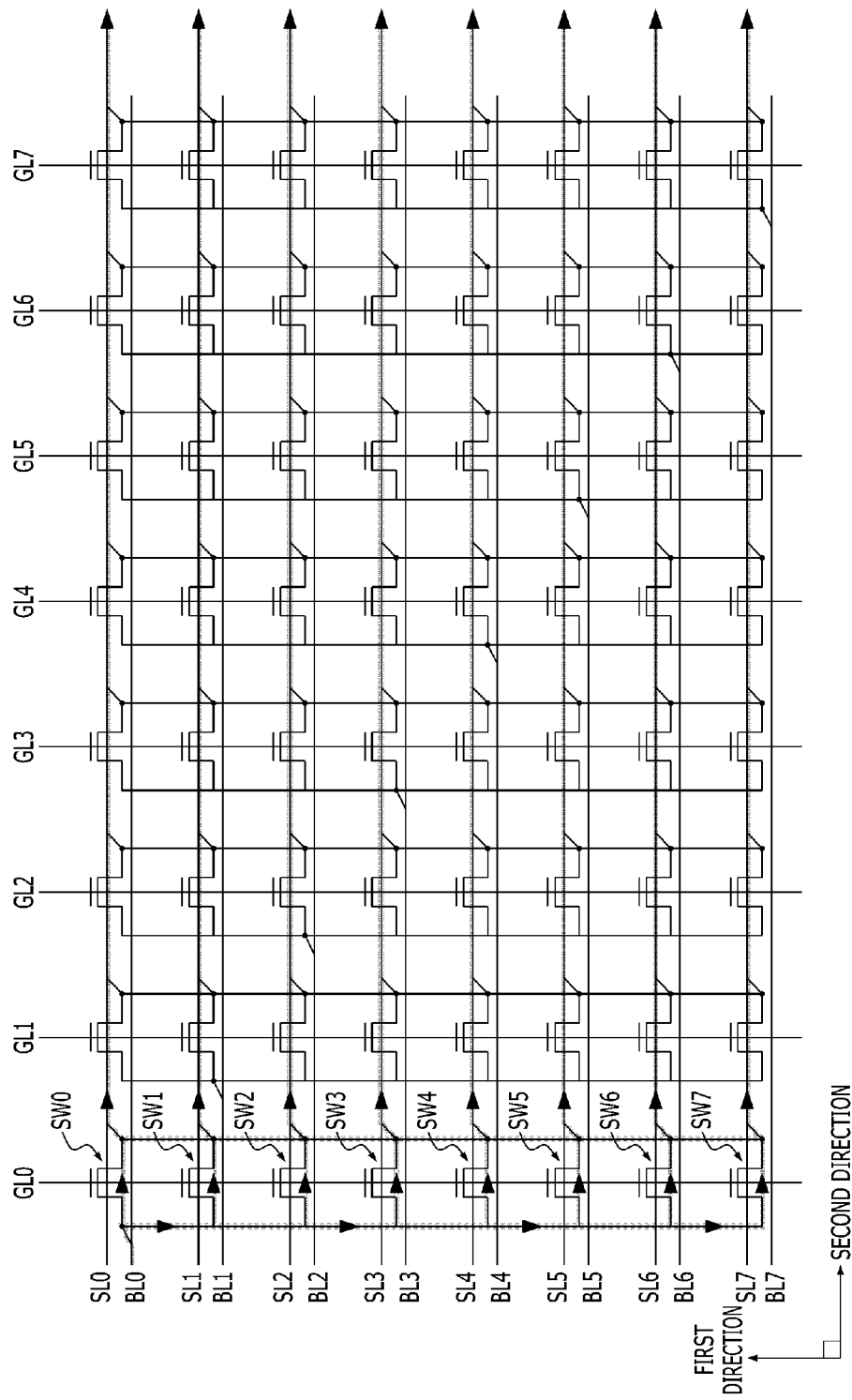
FIG. 5B is a diagram illustrating a data flow of FIG. 5A.

FIG. 5A is an equivalent circuit of a switching region shown in FIG. 4. FIG. 5B is a diagram illustrating a data flow of FIG. 5A.

Referring to FIG. 5A, eight bit lines BL0 to BL7, eight source lines SL0 to SL7 and eight gate lines GL0 to GL7 are disposed in the switching region LYSW. The eight source lines LS0 to SL7 correspond to the eight bit lines BL0 to BL7, and the eight gate lines GL0 to GL7 correspond to the eight bit lines BL0 to BL7. The eight bit lines BL0 to BL7 and the eight source lines SL0 to SL7 may be extended in the second direction. The eight gate lines GL0 to GL7 may be extended in the first direction.

In the multiple columns of switching transistors at different column positions along the second direction with each column including switching transistors SW0 to SW7 in the first direction, gates of eight switching transistors SW0 to SW7, which are disposed in the first direction in a particular column, may be coupled to the respective gate lines GL0 to GL7. Drains of the eight switching transistors SW0 to SW7 may be coupled from one another, and sources of the eight switching transistors SW0 to SW7 may be coupled from one another. A drain of the eight switching transistors SW0 to SW7, which is coupled to any one of the eight gate lines GL0 to GL7, may be coupled to a corresponding one of the eight bit lines BL0 to BL7. For example, a drain of the switching transistor SW0 among the eight switching transistors SW0 to SW7 coupled to a first gate line GL0 may be coupled to a first bit line BL0, and a drain of the switching transistor SW1 among the eight switching transistors SW0 to SW7 coupled to a second gate line GL1 may be coupled to a second bit line BL1. Sources of the eight switching transistors SW0 to SW7 may be coupled to the respectively source lines SL0 to SL7.

The eight bit lines BL0 to BL7 may be coupled to the respective bit lines of the mat region MAT (not shown). The eight source lines SL0 to SL7 may be coupled to the sense amplifier S/A through a global bit line GBL.

FIG. 5B illustrates an example of how data loaded on a bit line of the mat region MAT is transferred to the sense amplifier S/A. For example, a transmission path of data that is transferred to the first bit line BL0 will be described with an arrow of FIG. 5B.

Referring to FIG. 5B with respect to the first row of switching transistors SW0 to SW7 coupled to the first gate line GL0, data inputted from a corresponding bit line of the mat region MAT to the first bit line BL0 of the switching region LYSW may be transferred to drains of the eight switching transistors SW0 to SW7 coupled to the first gate GL0 through a drain of the first switching transistor SW0 coupled to the first gate line GL0 corresponding to the first bit line BL0. This is because the drains of the eight switching transistors SW0 to SW7 are coupled from one another.

If a voltage for turning on the eight switching transistors SW0 to SW7 is applied to the first gate line GL0, the data of the drain is transferred to the source through each channel of the eight switching transistors SW0 to SW7. Since the source are coupled from one another and are coupled to the respective eight source lines SL0 to SL7, data is output through the eight source lines SL0 to SL7. The output data may be transferred to the sense amplifier S/A through the global bit line GBL.

The data inputted to the first bit line BL0 may be transferred to the sense amplifier S/A through the eight switching transistors SW0 to SW7 coupled to the first gate line GL0. Since the eight switching transistors SW0 to SW7 are coupled in parallel, the resistance of the eight switching transistors SW0 to SW7 may be reduced. The data inputted to the remaining bit lines BL1 to BL7 may be transferred to the sense amplifier S/A through the eight switching transistors SW0 to SW7 coupled to the corresponding gate lines GL1 to GL7.

The semiconductor memory device having the above-described structure enables the switching transistor of the switching region LYSW and unit cell of the mat region MAT to be formed at the same time. Thus, since any additional process is not necessary, a manufacturing process can be simplified and a manufacturing cost can be reduced.

Moreover, since the selection transistor of the mat region MAT has substantially the same structure as the switching transistor of the switching region LYSW, the mat region MAT and the switching region LYSW may share a well region formed in the substrate 100. In other words, the mat region MAT and the switching region LYSW may be formed within the same well region. Thus, as compared with a case that the mat region MAT and the switching region LYSW are implemented in different well regions, an area required for the device can be reduced. As shown in FIG. 2, if a plurality of mat regions MAT and a plurality of switching regions LYSW are repeatedly disposed in the second direction, the plurality of mat regions MAT and the plurality of switching regions LYSW may be implemented within the same well region.

Also, since the switching transistor has a fin-shaped structure where an active region further protrudes than the isolation layer in the first direction, similarly to the selection transistor, a resistance of the switching transistors becomes low and a current driving capability increases. The plurality of switching transistors are coupled in parallel, the resistance of them may be reduced.

In the implementations above, the switching transistor of the switching region LYSW is coupled to the first bit line 151 of the mat region MAT and a signal of the first bit line 151 is transferred to the sense amplifier S/A. However, other implementations are also possible. For example, the switching transistor of the switching region LYSW is coupled to the first source line 161 of the mat region MAT and configured to control the coupling between the first source line 161 and an external interconnection. This case will be exemplarily described with reference to FIGS. 6A and 6B.

Figure 6A:
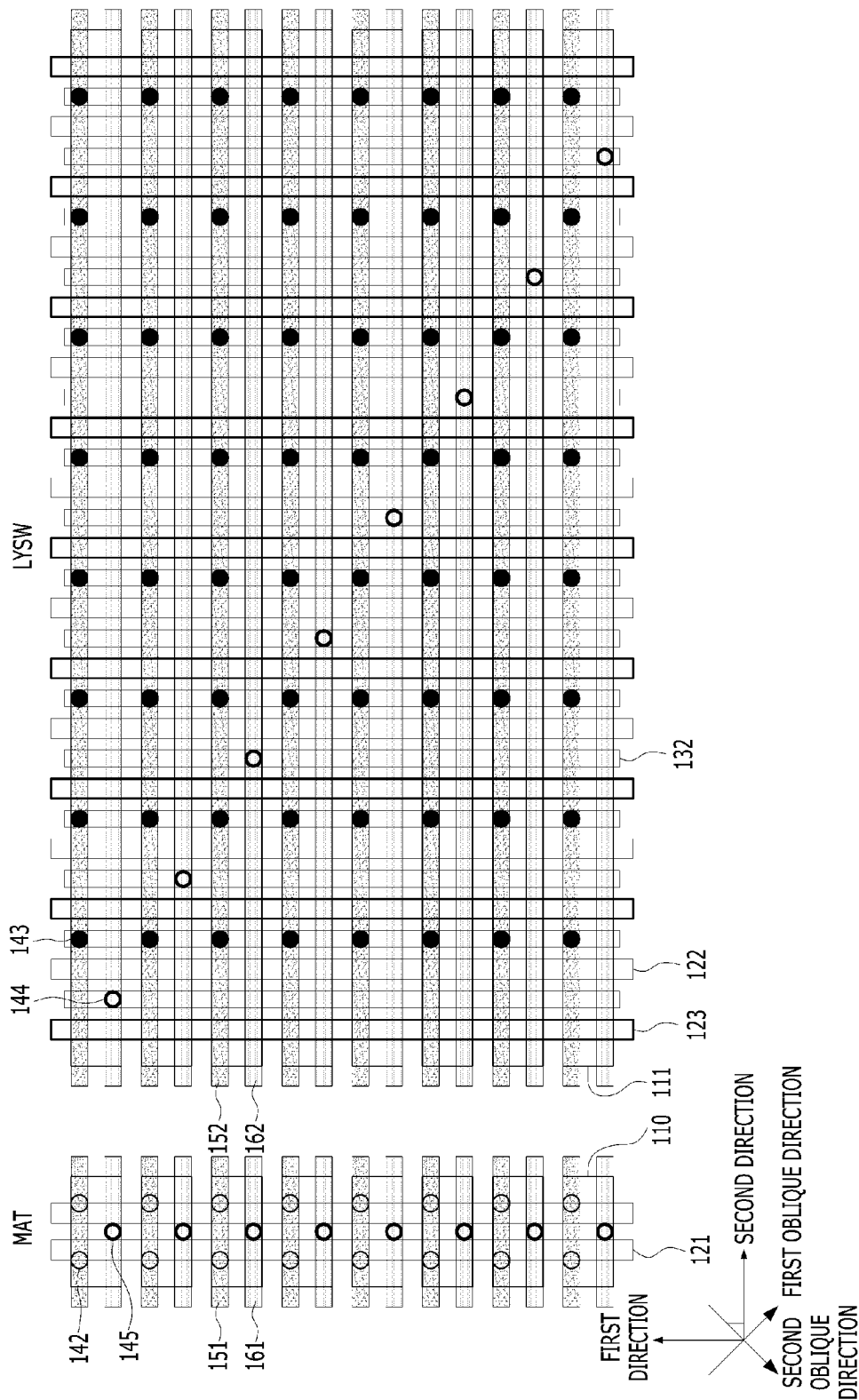
FIG. 6A is a plane diagram illustrating another example of the semiconductor memory device.

FIG. 6A is a plane diagram illustrating another example of the semiconductor memory device. FIG. 6B is an equivalent circuit of a switching region shown in FIG. 6A. Hereinafter, detailed descriptions will be omitted for the configurations that are substantially the same as those of the above-described implementations of the present disclosure. Same numeral number will be used for the substantially same configurations.

Referring to FIG. 6A, the source line 161 of the mat region MAT may be coupled to the second source line 162 of the switching region LYSW, and the first bit lines 151 are separated from the second bit lines 152.

In the switching region LYSW, each source line 162 is coupled to a corresponding third upper contact 144, and each second bit line 152 is coupled to second upper contacts 143 disposed in the second direction. Thus, the second sources of the switching transistors SW0 to SW7 coupled to a second gate 122 may be coupled from one another through the second lower contact on the left side of the second gate 122 and be coupled to the second source line 162 through the third upper contact 144. The second drains of the switching transistors SW0 to SW7 coupled to the second gate 122 may be coupled to the second lower contact 132 on the right side of the second gate 122, and be coupled to the eight second bit lines 152 through the second upper contact 143.

Referring to FIG. 6B, sources of the switching transistors SW0 to SW7 coupled to any one of the gate lines GL0 to GL7 may be coupled to a corresponding one of the source lines SL0 to SL7. For example, the sources of the switching transistors SW0 to SW7 coupled to the first gate line GL0 may be coupled to the first source line SL0. The sources of the switching transistors SW0 to SW7 coupled to the second gate line GL1 may be coupled to the second source line S11. The drains of the switching transistors SW0 to SW7 may be coupled to the respective bit lines BL0 to BL7.

The eight source lines SL0 to SL7 may be coupled to the source lines of the mat region (not shown), respectively. The eight bit lines BL0 to BL7 may be coupled to an external interconnection line through the global source line GSL. Detailed explanations will be omitted since a signal is transferred between the source lines SL0 to SL7 and the external interconnection line in the substantially same manner as that described in FIG. 5.

Hereinafter, a semiconductor memory device with improved contact margin will be described. For reference, in the above-described implementations of the present disclosure, the second upper contact 143 and the third upper contact 144 are alternately disposed at the same oblique straight line along the first oblique direction. Herein, since an interval between the second upper contact 143 and the third upper contact 144 is relatively small in the region where the second upper contact 143 and the third upper contact 144 are alternately disposed, the contact margin may be reduced.

Figure 7:
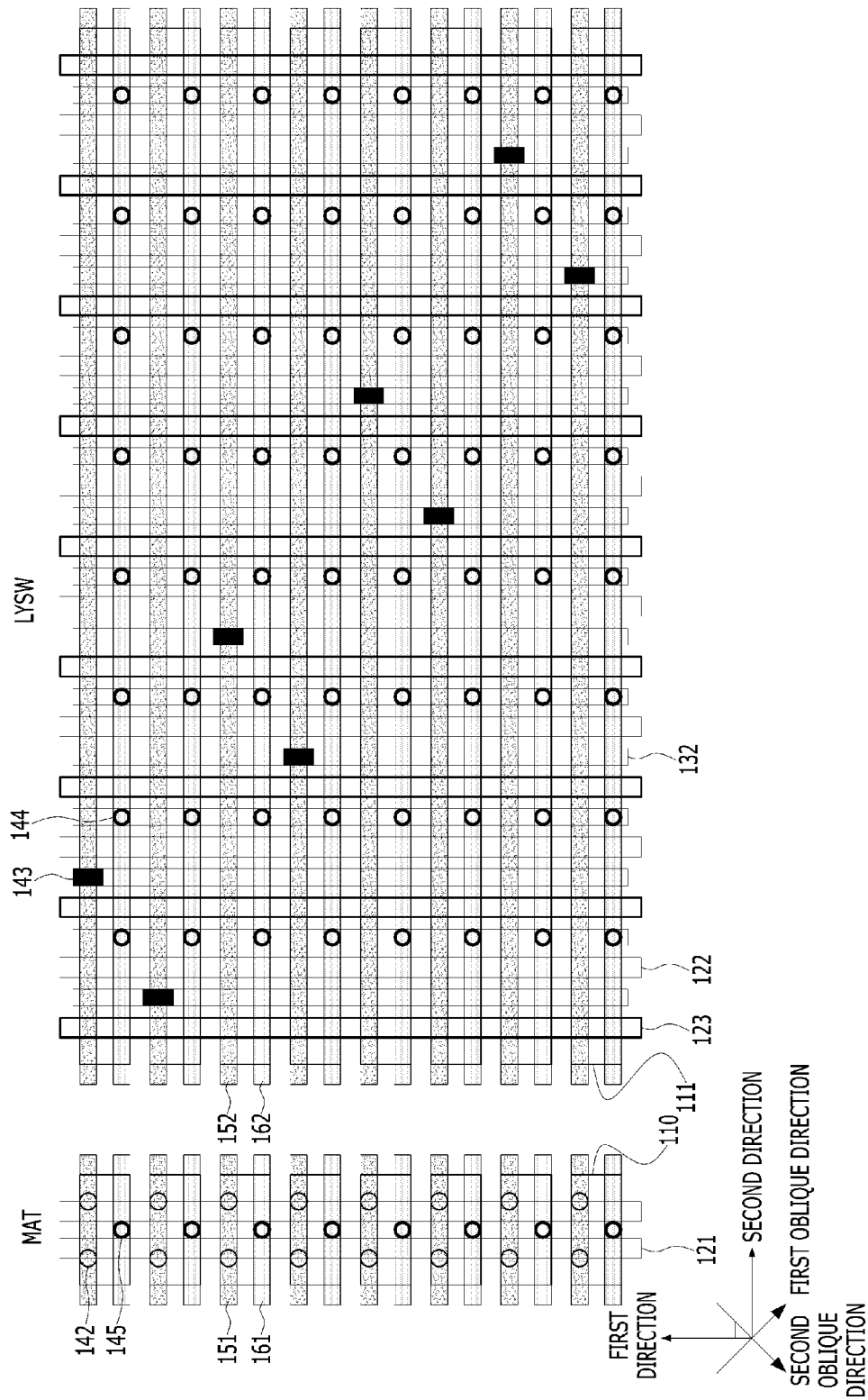
FIG. 7 is a plane diagram illustrating an exemplary semiconductor memory device in accordance with another implementation of the present disclosure.

FIG. 7 is a plane diagram illustrating a semiconductor memory device in accordance with another implementation of the present disclosure. Hereinafter, detailed descriptions will be omitted for the configuration that are substantially the same as those of the above-described implementations of the present disclosure. Same numeral numbers will be used for the substantially same configurations.

Referring to FIG. 7, in the semiconductor memory device in accordance with the implementation of the present disclosure, the first bit lines 151 of the mat region MAT may be coupled to the corresponding second bit lines 152 of the switching region LYSW, respectively. The first source lines 161 and the second source lines 162 may be separated from each other.

In the switching region LYSW, each second bit line 152 is coupled to a second upper contact 143, and each source line 162 is coupled to a plurality of third upper contacts 144 disposed in the second direction. Thus, the second drains of the switching transistors SW0 to SW7 coupled to the second gate 122 may be coupled from one another through the second lower contact 132 on the left side of the second gate 122, and be coupled to the corresponding second bit line 152 through the second upper contact 143. The second sources of the switching transistors SW0 to SW7 coupled to the second gate 122 may be coupled from one another through the second lower contact 132 on the right side of the second gate 122, and be coupled to the eight second source lines 162 through the third upper contact 144.

Herein, the disposition of the second upper contact 143 of the semiconductor memory device in accordance with the implementation of the present disclosure is different from the disposition of the second upper contact 143 of the semiconductor memory device in accordance with the first implementation of the present disclosure. While the first implementation provides the second upper contact 143 disposed at the same oblique straight line along the first oblique direction, the present implementation provides the second upper contact 143 disposed to have a zigzag shape along the first oblique direction.

The second upper contact 143 may be disposed to overlap with the corresponding second bit line 152 only among the second bit lines 152 disposed in the first direction. The second upper contact 143 may be disposed to overlap with the corresponding second active region 111 only among the second active region 111 disposed in the first direction. Accordingly, the disposition between the second upper contact 143 and the second bit line 152 is same as the disposition between the second upper contact 143 and the second active region 111.

The second bit line 152 corresponding to the second upper contact 143 may be determined according to a position of the second gate 122. For example, $N_{th}$ second gate 122 from a left side may correspond to $(N-1)_{th}$ or $(N+1)_{th}$ second bit line 152 from an upper side, where N is a natural number between one and eight, and the maximum number of N may be the number of second active regions 111 coupled by the second lower contact 132. If the $N_{th}$ second gate 122 (N is an odd number) is disposed at the $N_{th}$ position (N=1, 3, 5, 7) from the left side, the $N_{th}$ second gate 122 may correspond to the $(N+1)_{th}$ second bit line 162 from the upper side. If the $N_{th}$ second gate (N is an even number) is disposed at the $N_{th}$ position (N=2, 4, 6, 8) from the left side, the $N_{th}$ second gate 122 may correspond to the $(N-1)_{th}$ second bit line 162 from the upper side. Thus, the second gate 122 which is disposed at the first position from the left side may correspond to the second bit line 162 disposed at the second position from the upper side. The second gate 122 which is disposed at the second position from the left side may correspond to the second bit line 162 disposed at the first position from the upper side.

Meanwhile, the third upper contacts 144 may overlap with the second active region 111 disposed in the first direction. Some of the second upper contacts 143 and some of the third upper contacts 144 are disposed at the oblique line along the first oblique direction. One second upper contact 143 and two third upper contacts 144 may be alternately disposed along the oblique line. In one implementation, FIG. 7 shows two oblique lines in parallel, each including the one second upper contact 143 and two third upper contacts 144 that alternately disposed along the first oblique direction. Some of the second upper contacts 143 may be disposed in both sides of the third contact 144 along the second oblique direction crossing the first oblique direction. The third upper contacts 144 which have second upper contacts 143 disposed in both sides of third upper contacts 144 are disposed at one side of $N_{th}$ second gate 122 (N is an odd number) overlapping with $N_{th}$ second active region 111 (N is an odd number)

As the second upper contact 143 is disposed to have a zigzag shape along the first oblique direction, the interval between the second upper contact 143 and the third upper contact 144 may be increased, and a contact margin can be improved. As the interval between the second upper contact 143 and the third upper contact 144 is increased, the contact area can be increased and the contact margin can be further improved. The second upper contact 143 and the third upper contact 144 may have an island shape or a hole shape to secure the interval between the second upper contact 143 and the third upper contact 144. The contact area of the second upper contact 143 which is disposed to have a zigzag shape may be greater than the contact area of the third upper contact 144. Thus, a plane shape of the second upper contact 143 may be or include a rectangular shape, and a plane shape of the third upper contact 144 may be or include a circle shape or a square shape.

As described above, the semiconductor memory device in accordance with the present implementation of the present disclosure can reduce an area of the switching region, improve a characteristic of the device by reducing a resistance of witching transistors, simplify a manufacturing process, and reduce manufacturing costs. Moreover, the semiconductor memory device in accordance with the present implementation of the present disclosure may improve the contact margin between the second upper contact 143 and the third upper contact 144 as the second upper contact 143 is disposed to have the zigzag shape in the first oblique direction.

Figure 8:
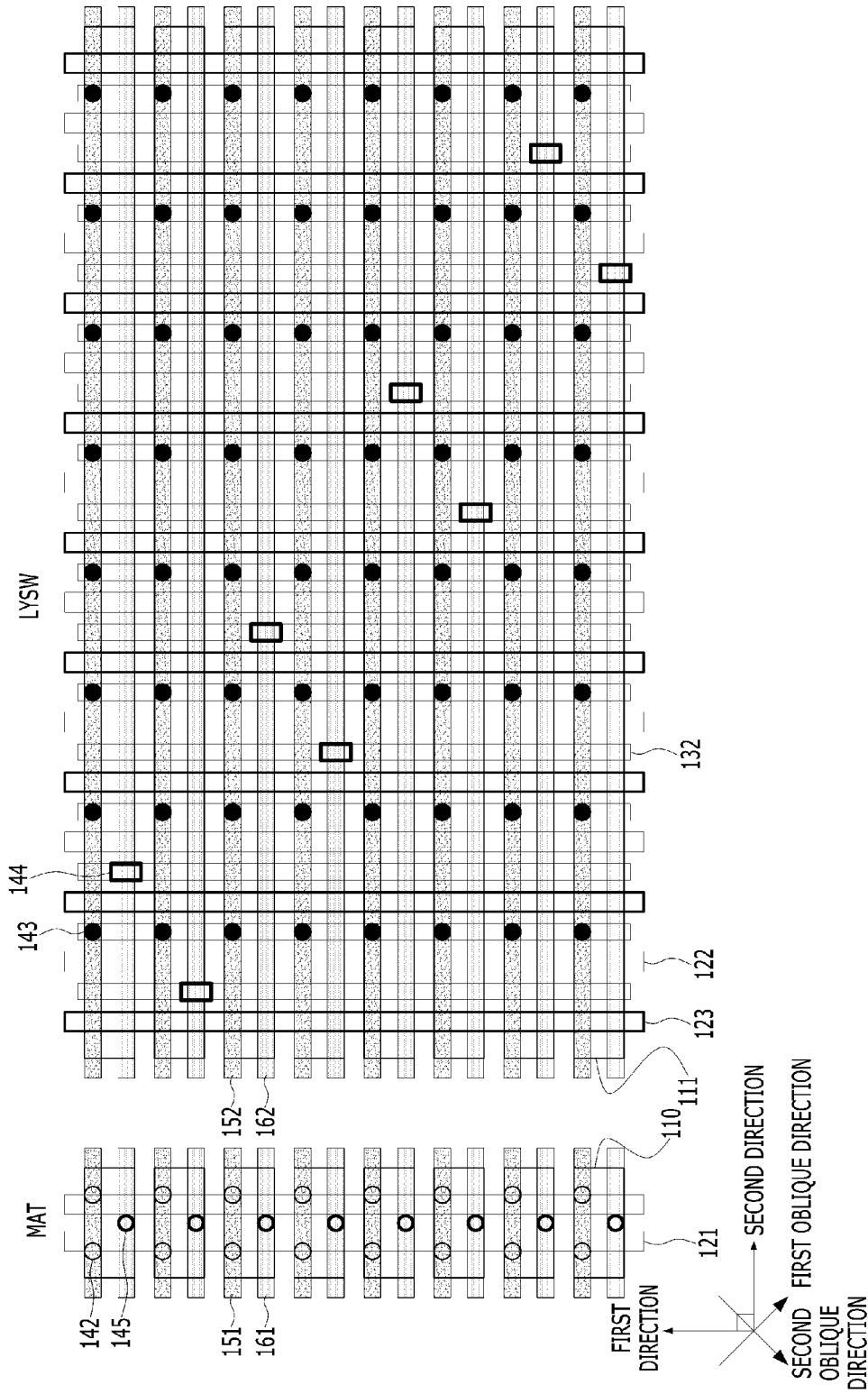
FIG. 8 is a plane diagram illustrating another example of the semiconductor memory device.

FIG. 8 is a plane diagram illustrating another example of the semiconductor memory device. Hereinafter, detailed descriptions will be omitted for the configurations that are substantially the same as those of the above-described implementations of the present disclosure. Same numeral numbers will be used for the substantially same configurations.

Referring to FIG. 8, the first source lines 161 of the mat region MAT may be coupled to the corresponding second source lines 162 of the switching region LYSW, respectively, and the first bit lines 151 and the second bit lines 152 may be separated from each other.

In the switching region LYSW, each second source line is coupled to a third upper contact 144, and each second bit line is coupled to a plurality of second upper contacts 143 disposed in the second direction. Thus, the second sources of the eight switching transistors SW0 to SW7 coupled to one second gate 122 may be coupled from one another through the second lower contact 132 at the left side of the second gate 122, and be coupled to the corresponding second source line 162 through the third upper contact 144. The second drains of the eight switching transistors SW0 to SW7 coupled to one second gate 122 may be coupled from one another through the second lower contact 132 at the right side of the second gate 122, and be coupled to the eight second bit lines 152 through the second upper contact 143.

In this implementation of the present disclosure, the second upper contact 143 may overlap with each second active region 111, and be disposed to have a matrix shape by being apart from one another in the first direction and the second direction. The third upper contact 144 may be disposed to have a zigzag shape in the first oblique direction.

Figure 9:
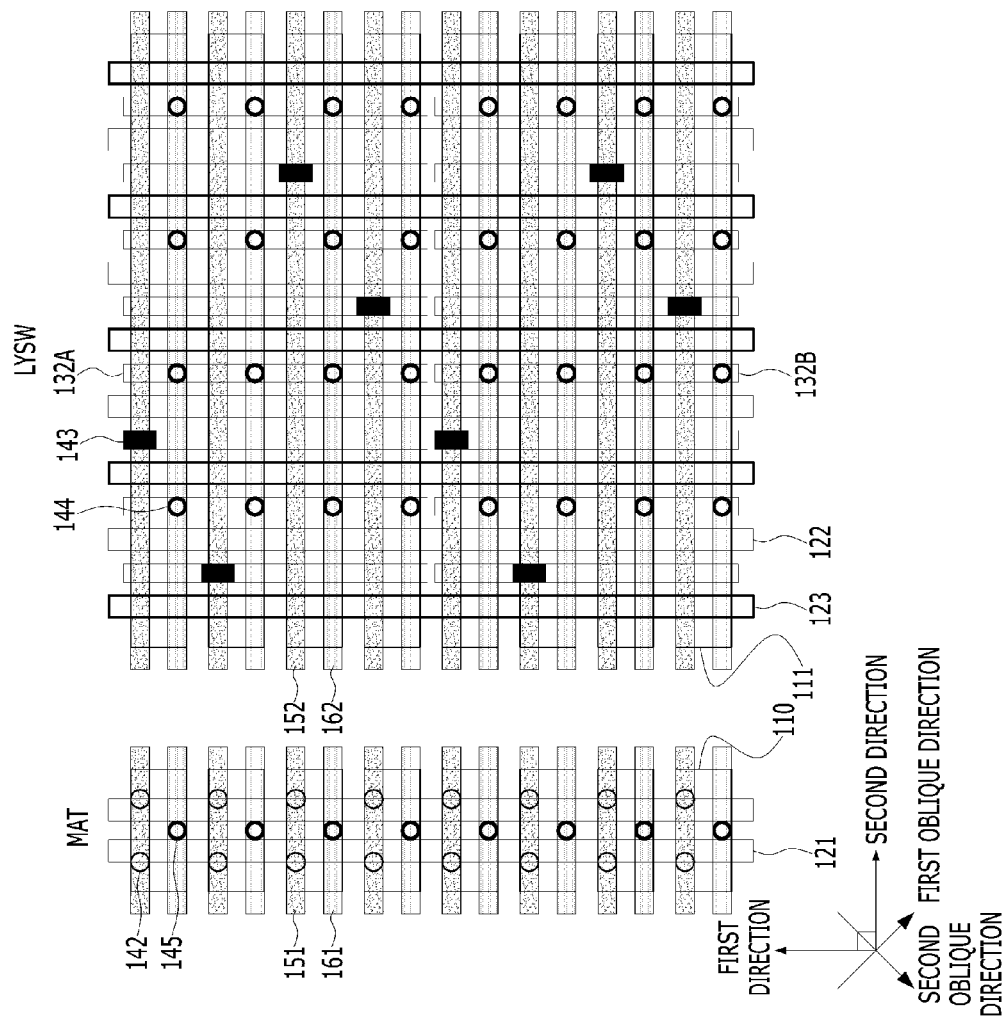
FIG. 9 is a plane diagram illustrating an exemplary semiconductor memory device in accordance with another implementation of the present disclosure.
Figure 10:
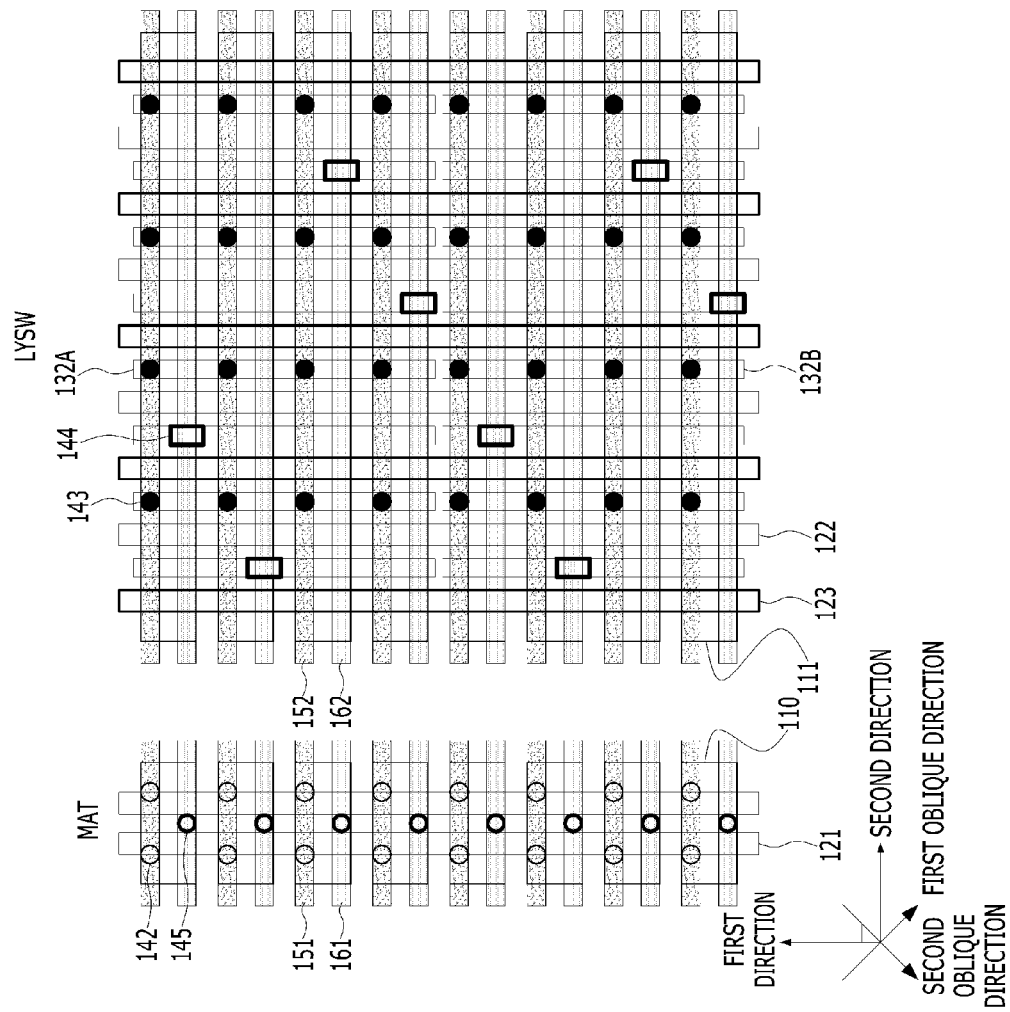
FIG. 10 is a plane diagram illustrating another example of the semiconductor memory device.

In the above-described implementations of the present disclosure, the second lower contact 132 is coupled to the eight second active regions 111 in the first direction in the switching region LYSW. However, other implementations are also possible. For example, the number of the second active regions coupled to the second lower contact 132 may be adjusted. For example, N number of second active regions 111 are classified into N/2n number of groups, and each group includes 2n number of second active regions, where N is a natural number. The second lower contact 132 may be coupled to each of the second active regions 111 within each of N/2n number of groups. As shown in FIGS. 9 and 10, eight number of second active regions are classified into two groups including an upper group and a lower group, and the second lower contact 132 may be coupled to four second active regions within each of two groups.

FIG. 9 is a plane diagram illustrating a semiconductor memory device. Hereinafter, detailed descriptions will be omitted for the configurations that are substantially the same as those of the above-described implementations of the present disclosure. Same numeral numbers will be used for the substantially same configurations.

Referring to FIG. 9, in the semiconductor memory device in accordance with the present implementation of the present disclosure, upper second lower contacts 132A contact with four second active regions 111 at one side of the second gate 122. The four second active regions 111 that contact with the upper second lower contacts 132A are disposed in the upper side along the first direction as compared to the remaining second active regions. Lower second lower contacts 132B contact with four second active regions 111 at the other side of the second gate 122. The four second active regions 111 that contact with the lower second lower contacts 132B are disposed in the lower side along the first direction as compared to the remaining second active regions. Thus, the number of the second lower contacts 132A and 132B are increased by double, and the number of second gates 122 is decreased by a half. Thus, the semiconductor memory device in accordance with the implementations of the present disclosure may reduce an area of the semiconductor memory device.

In the semiconductor memory device in accordance with the present implementation of the present disclosure, the second upper contact 143 may overlap with the corresponding second active region 111 among four second active regions 111 coupled with the upper second lower contact 132A. The second upper contact 143 may overlap with the corresponding second active region 111 among four second active regions 111 coupled with the lower second lower contact 132B. For example, $N_{th}$ second gate 122 from the left side may correspond to (N−1)th or (N+1)th second bit line 152 from the upper side, where N is a natural number between one and four, and the maximum number of N may be number of second active regions 111 coupled with the second lower contacts 132A and 132B.

The third upper contact 144 may overlap with each second active region 111 disposed in the first direction. That is, the position of the second upper contacts 143 on the upper second lower contacts 132A is substantially same as the position of the second upper contact 143 on the lower second lower contacts 132B. Thus, the second upper contacts 143 on the upper second lower contacts 132A and the second upper contacts 143 on the lower second lower contacts 132B may be disposed to have a zigzag shape in the first oblique direction, and the third upper contact 144 and the second upper contact 143 may be alternately disposed in the second oblique direction.

The semiconductor memory device in accordance with the above-described implementation of the present disclosure may further reduce an area of the switching regions LYSW as the second lower contact 132A and 132B are separated from each other. Also, the semiconductor memory device may improve a characteristic of the semiconductor memory device by reducing a resistance of the switching transistors, simplify a manufacturing process and reduce manufacturing costs. Furthermore, the contact margin between the second upper contact 143 and the third upper contact 144 may be improved by disposing the second upper contact 143 to have a zigzag shape in the first oblique direction.

FIG. 10 is a plane diagram illustrating another example of the semiconductor memory device. Hereinafter, detailed descriptions will be omitted for the configurations that are substantially the same as those of the above-described implementations of the present disclosure. Same numeral numbers will be used for the substantially same configurations.

Referring to FIG. 10, in the semiconductor memory device in accordance with the present implementation of the present disclosure, upper second lower contacts 132A contact with four second active regions 111 at one side of the second gate 122. The four second active regions 111 that contact with the upper second lower contacts 132A are disposed in the upper side along the first direction as compared to the remaining second active regions. Lower second lower contacts 132B contact with four second active regions 111 at the other side of the second gate 122. The four second active regions 111 that contact with the lower second lower contacts 132B are disposed in the lower side along the first direction as compared to the remaining second active regions. The first source lines 161 of the mat region MAT may be coupled to the corresponding second source lines 162 of the switching region LYSW, and the first bit lines 151 and the second bit lines 152 may be separated from each other. In the switching region LYSW, each second source line 162 is coupled to a third upper contact 144, and each second bit line 152 is coupled to a plurality of second upper contact lines 143 disposed in the second direction.

The third upper contact 144 may overlap with the corresponding second active region 111 among the four second active regions 111 coupled with the upper second lower contact 132A. The third upper contact 144 may overlap with the corresponding second active region 111 among the four second active regions 111 coupled with the lower second lower contact 132B. The second upper contact 143 may be disposed to overlap with each of the second active region 111 disposed in the first direction and each of the second bit lines 152 disposed in the first direction. Thus, the third upper contact 144 on the upper second lower contact 132A and the third upper contact 144 on the lower second lower contact 132B may be disposed to have a zigzag shape in the first oblique direction. The third upper contact 144 and the second upper contact 143 may be alternately disposed in the second oblique direction.

In the above-described implementations of the present disclosure, a third gate 123 is disposed between second gates 122, but the present disclosure is not limited thereto and other implementations are also possible. For example, as described below with reference to FIGS. 11 and 12, two second gates 122 may be disposed between third gates 123.

Figure 11:
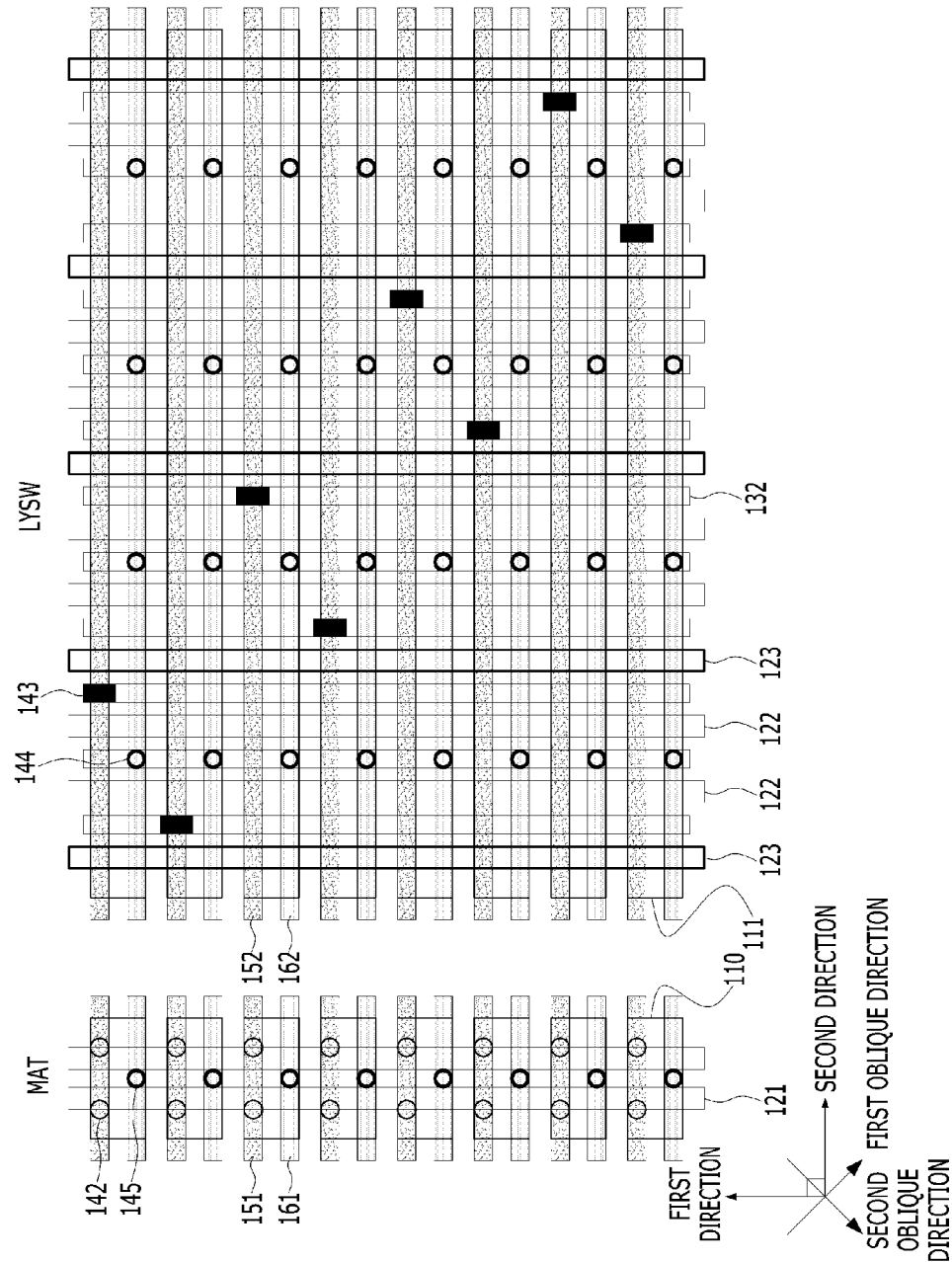
FIG. 11 is a plane diagram illustrating an exemplary semiconductor memory device in accordance with another implementation of the present disclosure.

FIG. 11 is a plane diagram illustrating a semiconductor memory device in accordance with another implementation of the present disclosure. Hereinafter, detailed descriptions will be omitted for the configurations that are substantially the same as those of the above-described implementations of the present disclosure. Same numeral numbers will be used for the substantially same configurations.

Referring to FIG. 11, in the semiconductor memory device in accordance with the present implementation of the present disclosure, two second gates 122 may be disposed between third gates 123. A junction between two second gates 122 may be shared. Thus, the number of third gates 123 may be reduced to about a half, and the number of second lower contacts 132 is reduced to about three quarters. An area of the semiconductor memory device in accordance with the fourth implementation of the present disclosure can be reduced.

In the semiconductor memory device in accordance with the implementation of the present disclosure, the second upper contact 143 may be disposed between the second gate 122 and the third gate 123, and overlap with the corresponding second active region 111 among the second active regions 111 disposed in the first direction. The third upper contact 144 may be disposed between the second gates 122 and may overlap with each second active region 111 disposed in the first direction.

The second bit line 52 corresponding to the second upper contact 143 may be determined according to a position of the second gate 122. For example, $N_{th}$ second gate 122 from a left side may correspond to $(N-1)_{th}$ or $(N+1)_{th}$ second bit line from an upper side, where N is a natural number between 1 and 8. The maximum value of N may be the number of the second active regions 111 coupled by the second lower contact 132.

The third upper contact 144 may be disposed to overlap with the second active region 111 disposed in the first direction. Thus, some of the plurality of second upper contacts 143 and some of the plurality of third upper contacts 144 may be disposed in the first oblique direction, and the second upper contact 143 and the third upper contact 144 may be alternately disposed. In one implementation, FIG. 11 shows to oblique lines in parallel with the first oblique direction, each including the upper contact 143 and the third upper contact 144 that are alternately disposed. Some of the second upper contacts 143 may be disposed in both sides of the third upper contact 144 along the second oblique direction crossing the first oblique direction. The third upper contacts 144 which have second upper contacts 143 disposed in both sides of the third upper contacts 144 are disposed at one side of the $N_{th}$ second gate 122 (N is an odd number) and overlaps with the $N_{th}$ second active region 111.

As described above, the semiconductor memory device in accordance with the present implementation of the present disclosure may reduce an area of the switching region LYSW as one third gate 123 and two second gates 122 are repeatedly disposed. The semiconductor memory device may improve a characteristic thereof by reducing a resistance of the switching transistors, simplify a manufacturing process and reduce manufacturing costs. The semiconductor memory device may improve a contact margin between the second upper contact 143 and the third upper contact 144 by disposing the second upper contact 143 to have a zigzag shape.

Figure 12:
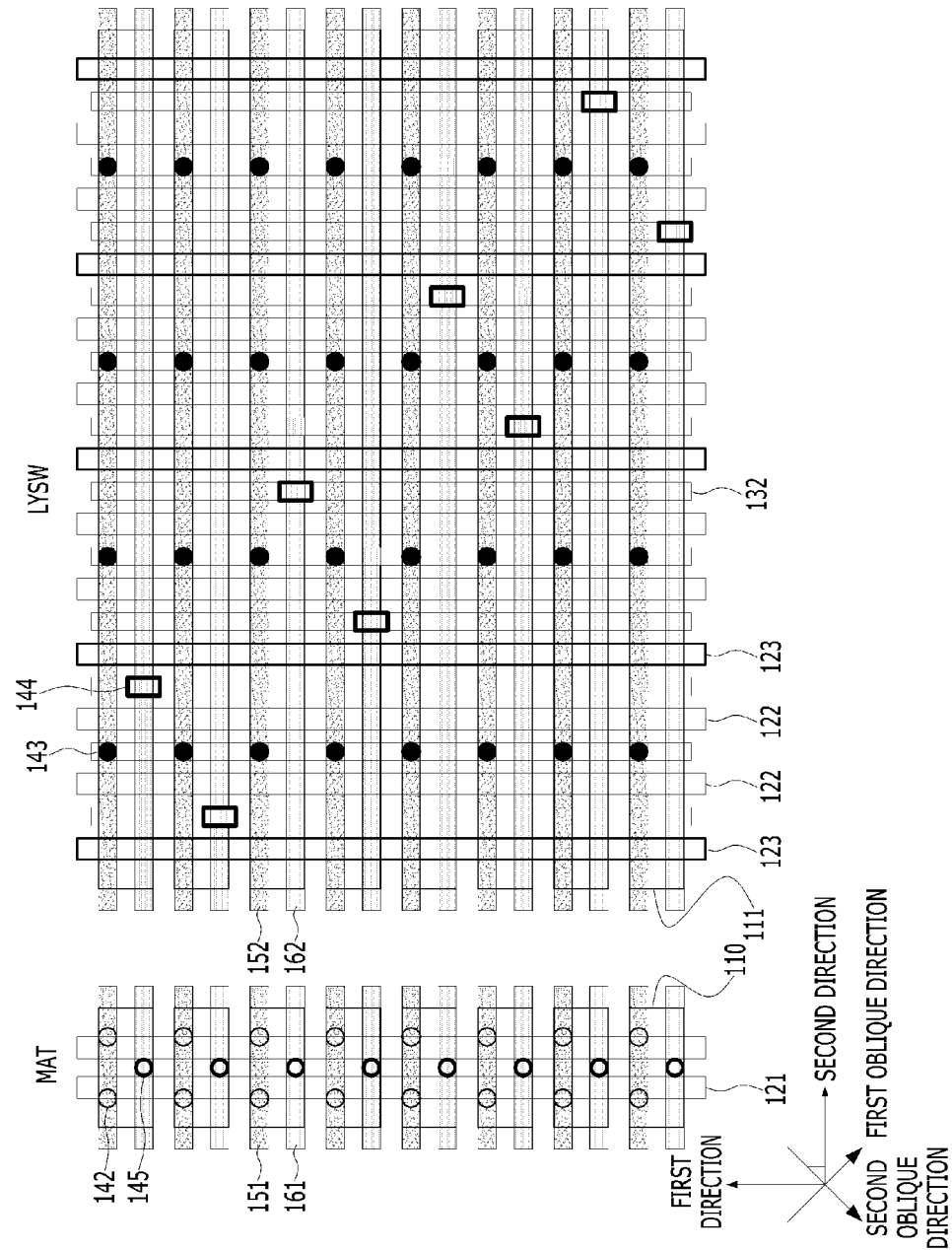
FIG. 12 is a plane diagram illustrating another example of the semiconductor memory device.

FIG. 12 is a plane diagram illustrating another implementation of the semiconductor memory device. Hereinafter, detailed descriptions will be omitted for the configurations that are substantially the same as those of the above-described implementations of the present disclosure. Same numeral number will be used for the substantially same configurations.

Referring to FIG. 12, one third gate 123 and two second gates 122 may be repeatedly disposed. A junction between two second gates 122 may be shared. The first source lines 161 of the mat region MAT may be coupled to the corresponding second source lines of the switching region LYSW. The first bit lines 151 and the second bit lines 152 may be separated from each other.

The third upper contact 144 may be disposed between the second gate 122 and the third gate 123 and overlap with the corresponding second active region 111 among the second active regions 111 disposed in the first direction. The second upper contact 143 may be disposed between the second gates 122 and overlap with the second active regions 111 disposed in the first direction. The third upper contact 144 may be disposed to have a zigzag shape across the first oblique direction.

The above and other memory circuits or semiconductor devices based on the disclosed technology may be used in various range of devices or systems. FIGS. 13-17 provide some examples of devices or systems that may implement the memory circuits disclosed herein.

Figure 13:
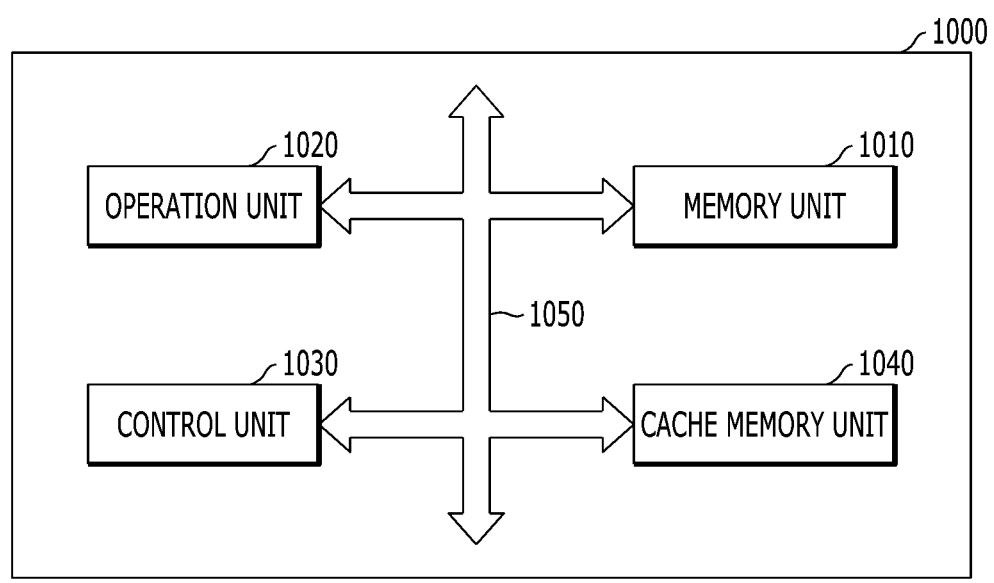
FIG. 13 is an example of configuration diagram of a microprocessor implementing memory circuitry based on the disclosed technology.

FIG. 13 is an example of configuration diagram of a microprocessor implementing memory circuitry based on the disclosed technology.

Referring to FIG. 13, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a substrate including a plurality of active regions, which are extended in a second direction and disposed from each other in a first direction across with the second direction, a plurality of gates extended in the first direction and across with the plurality of active regions, a lower contact disposed in both sides of the plurality of gates and coupling the plurality of active regions in the first direction, an upper contact of the lower contact overlapping with the active region out of the plurality of active regions in a side of each of the plurality of gates, and overlapping with the plurality of active regions in the other side of each of the plurality of gates, and a plurality of first and second interconnection lines coupled to the upper contact, extended in the second direction, and being alternately disposed from each other in the first direction, and the upper contact of a side of the gates may have a zigzag shape in a first oblique direction. Thus, an area may be reduced, a resistance may be reduced, a manufacturing process may be simplified, a manufacturing cost may be reduced, and a contact margin may be improved. Through this, a data storage characteristic of the memory unit 1010 may be improved and a characteristic of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 14:
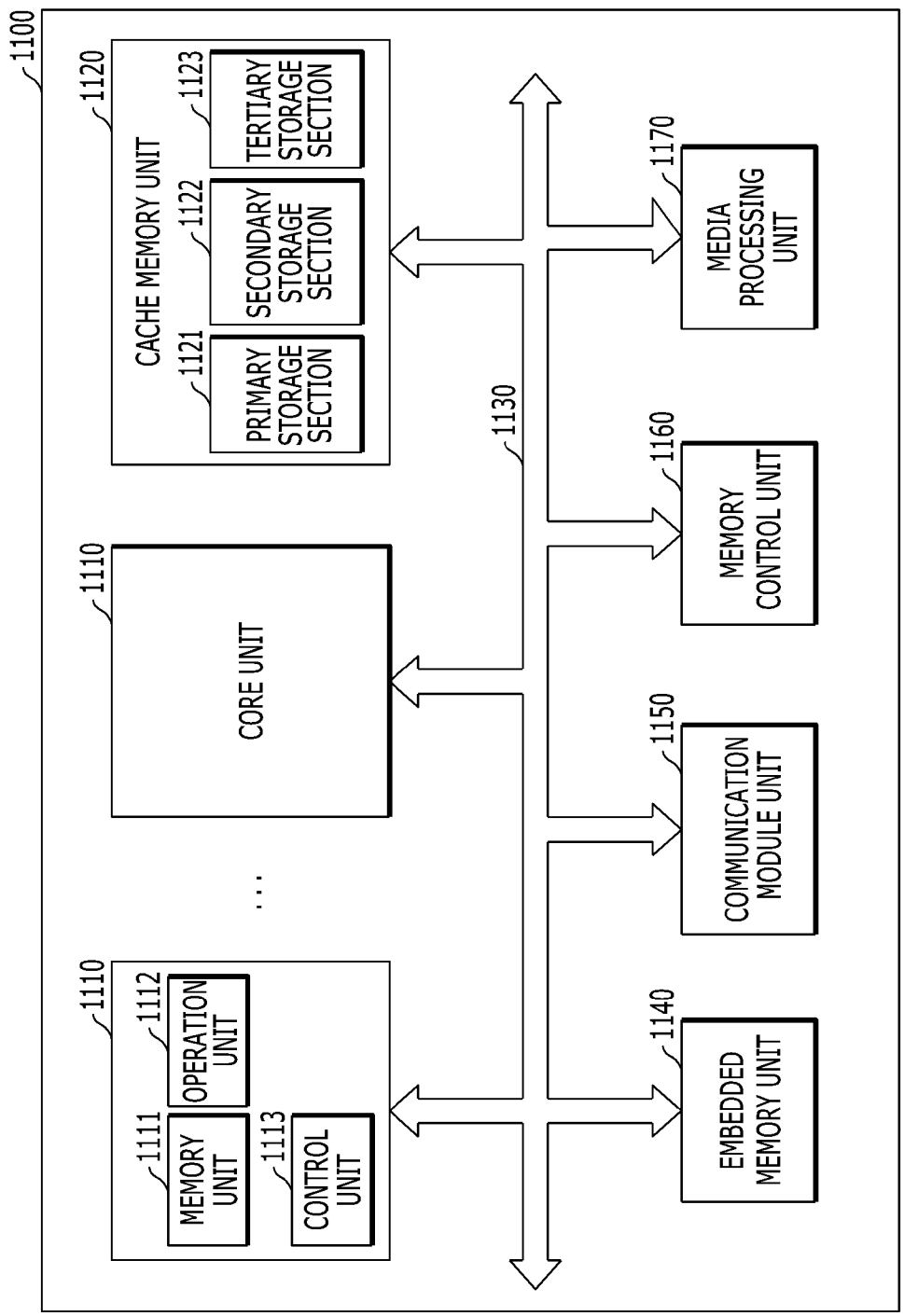
FIG. 14 is an example of configuration diagram of a processor implementing memory circuitry based on the disclosed technology.

FIG. 14 is an example of configuration diagram of a processor implementing memory circuitry based on the disclosed technology.

Referring to FIG. 14, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a substrate including a plurality of active regions, which are extended in a second direction and disposed from each other in a first direction across with the second direction, a plurality of gates extended in the first direction and across with the plurality of active regions, a lower contact disposed in both sides of the plurality of gates and coupling the plurality of active regions in the first direction, an upper contact of the lower contact overlapping with the active region out of the plurality of active regions in a side of each of the plurality of gates, and overlapping with the plurality of active regions in the other side of each of the plurality of gates, and a plurality of first and second interconnection lines coupled to the upper contact, extended in the second direction, and being alternately disposed from each other in the first direction, and the upper contact of a side of the gates may have a zigzag shape in a first oblique direction. Thus, an area may be reduced, a resistance may be reduced, a manufacturing process may be simplified, a manufacturing cost may be reduced, and a contact margin may be improved. Through this, a data storage characteristic of the cache memory unit 1120 may be improved and a characteristic of the processor 1100 may be improved.

Although it was shown in FIG. 14 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 15:
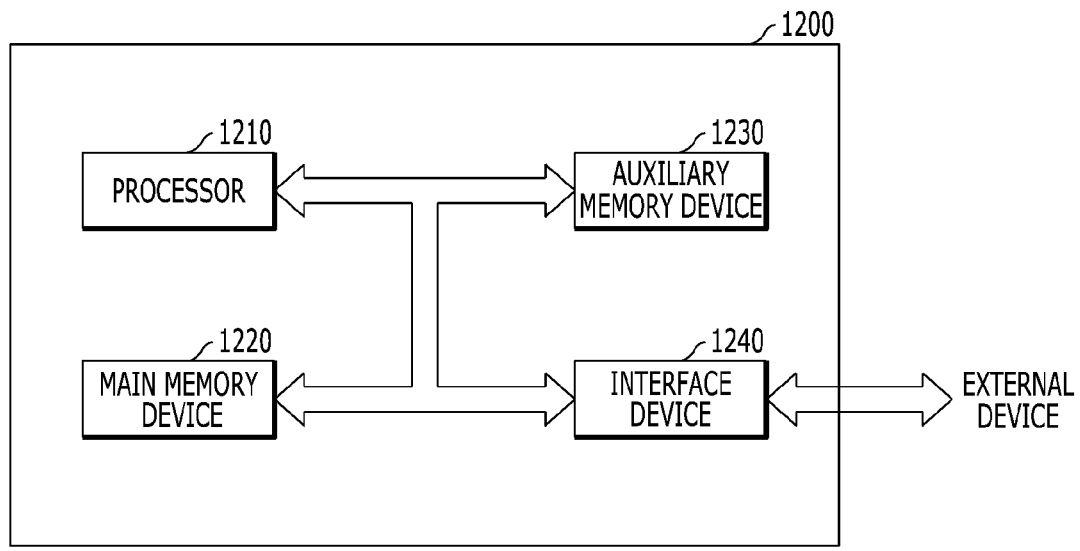
FIG. 15 is an example of configuration diagram of a system implementing memory circuitry based on the disclosed technology.

FIG. 15 is an example of configuration diagram of a system implementing memory circuitry based on the disclosed technology.

Referring to FIG. 15, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which may temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a substrate including a plurality of active regions, which are extended in a second direction and disposed from each other in a first direction across with the second direction, a plurality of gates extended in the first direction and across with the plurality of active regions, a lower contact disposed in both sides of the plurality of gates and coupling the plurality of active regions in the first direction, an upper contact of the lower contact overlapping with the active region out of the plurality of active regions in a side of each of the plurality of gates, and overlapping with the plurality of active regions in the other side of each of the plurality of gates, and a plurality of first and second interconnection lines coupled to the upper contact, extended in the second direction, and being alternately disposed from each other in the first direction, and the upper contact of a side of the gates may have a zigzag shape in a first oblique direction. Thus, an area may be reduced, a resistance may be reduced, a manufacturing process may be simplified, a manufacturing cost may be reduced, and a contact margin may be improved. Through this, a data storage characteristic of the main memory device 1220 may be improved and a characteristic of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a substrate including a plurality of active regions, which are extended in a second direction and disposed from each other in a first direction across with the second direction, a plurality of gates extended in the first direction and across with the plurality of active regions, a lower contact disposed in both sides of the plurality of gates and coupling the plurality of active regions in the first direction, an upper contact of the lower contact overlapping with the active region out of the plurality of active regions in a side of each of the plurality of gates, and overlapping with the plurality of active regions in the other side of each of the plurality of gates, and a plurality of first and second interconnection lines coupled to the upper contact, extended in the second direction, and being alternately disposed from each other in the first direction, and the upper contact of a side of the gates may have a zigzag shape in a first oblique direction. Thus, an area may be reduced, a resistance may be reduced, a manufacturing process may be simplified, a manufacturing cost may be reduced, and a contact margin may be improved. Through this, a data storage characteristic of the auxiliary memory device 1230 may be improved and a characteristic of the system 1200 may be improved.

Also, the auxiliary memory device 1230 may further include a data storage system (see the reference numeral 1300 of FIG. 16) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 16) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 16:
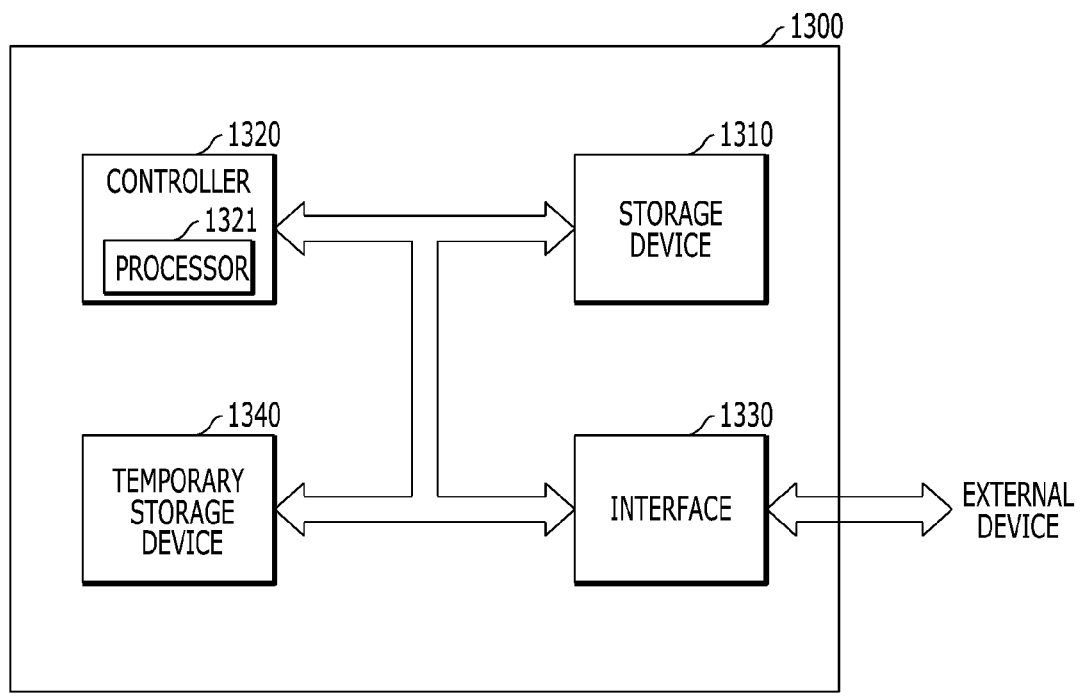
FIG. 16 is an example of configuration diagram of a data storage system implementing memory circuitry based on the disclosed technology.

FIG. 16 is an example of configuration diagram of a data storage system implementing memory circuitry based on the disclosed technology.

Referring to FIG. 16, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. For example, the temporary storage device 1340 may include a substrate including a plurality of active regions, which are extended in a second direction and disposed from each other in a first direction across with the second direction, a plurality of gates extended in the first direction and across with the plurality of active regions, a lower contact disposed in both sides of the plurality of gates and coupling the plurality of active regions in the first direction, an upper contact of the lower contact overlapping with the active region out of the plurality of active regions in a side of each of the plurality of gates, and overlapping with the plurality of active regions in the other side of each of the plurality of gates, and a plurality of first and second interconnection lines coupled to the upper contact, extended in the second direction, and being alternately disposed from each other in the first direction, and the upper contact of a side of the gates may have a zigzag shape in a first oblique direction. Thus, an area may be reduced, a resistance may be reduced, a manufacturing process may be simplified, a manufacturing cost may be reduced, and a contact margin may be improved. Through this, a data storage characteristic of the temporary storage device 1340 may be improved and a characteristic of the data storage system 1300 may be improved.

Figure 17:
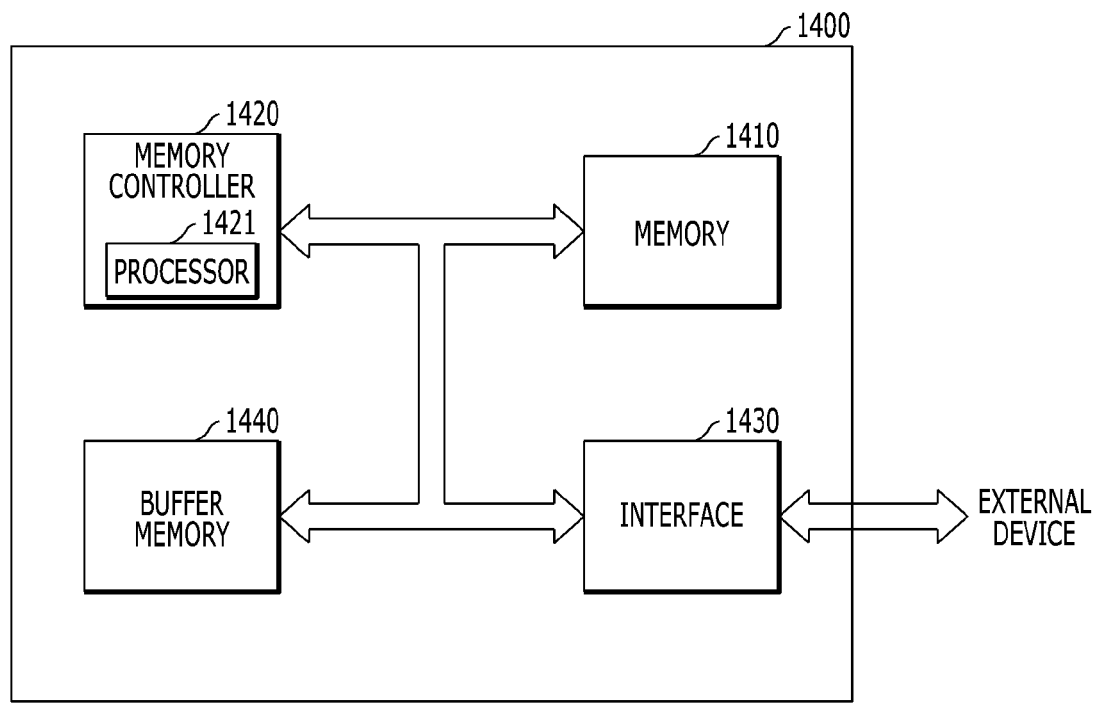
FIG. 17 is an example of configuration diagram of a memory system implementing memory circuitry based on the disclosed technology.

FIG. 17 is an example of configuration diagram of a memory system implementing memory circuitry based on the disclosed technology.

Referring to FIG. 17, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a substrate including a plurality of active regions, which are extended in a second direction and disposed from each other in a first direction across with the second direction, a plurality of gates extended in the first direction and across with the plurality of active regions, a lower contact disposed in both sides of the plurality of gates and coupling the plurality of active regions in the first direction, an upper contact of the lower contact overlapping with the active region out of the plurality of active regions in a side of each of the plurality of gates, and overlapping with the plurality of active regions in the other side of each of the plurality of gates, and a plurality of first and second interconnection lines coupled to the upper contact, extended in the second direction, and being alternately disposed from each other in the first direction, and the upper contact of a side of the gates may have a zigzag shape in a first oblique direction. Thus, an area may be reduced, a resistance may be reduced, a manufacturing process may be simplified, a manufacturing cost may be reduced, and a contact margin may be improved. Through this, a data storage characteristic of the memory 1410 may be improved and a characteristic of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a substrate including a plurality of active regions, which are extended in a second direction and disposed from each other in a first direction across with the second direction, a plurality of gates extended in the first direction and across with the plurality of active regions, a lower contact disposed in both sides of the plurality of gates and coupling the plurality of active regions in the first direction, an upper contact of the lower contact overlapping with the active region out of the plurality of active regions in a side of each of the plurality of gates, and overlapping with the plurality of active regions in the other side of each of the plurality of gates, and a plurality of first and second interconnection lines coupled to the upper contact, extended in the second direction, and being alternately disposed from each other in the first direction, and the upper contact of a side of the gates may have a zigzag shape in a first oblique direction. Thus, an area may be reduced, a resistance may be reduced, a manufacturing process may be simplified, a manufacturing cost may be reduced, and a contact margin may be improved. Through this, a data storage characteristic of the buffer memory 1440 may be improved and a characteristic of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

As is apparent from the above descriptions, in the semiconductor device and the method for fabricating the same in accordance with the implementations, patterning of a resistance variable element is easy, and it is possible to secure the characteristics of the resistance variable element.

Features in the above examples of electronic devices or systems in FIGS. 13-17 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory unit that comprises:
   a substrate including a plurality of active regions, which are extended in a second direction and disposed from each other in a first direction across with the second direction;
   a plurality of gates extended in the first direction and crossing the plurality of active regions;
   lower contacts disposed at both sides of each of the plurality of gates and coupling the plurality of active regions in the first direction;
   upper contacts formed over the lower contacts and including first upper contacts, each first upper contact overlapping with a corresponding active region of the plurality of active regions at a first side of each of the plurality of gates, and including second upper contacts overlapping with the plurality of active regions at a second side of each of the plurality of gates; and
   a plurality of first and second interconnection lines coupled to the upper contact, extended in the second direction, and being alternately disposed from each other in the first direction,
   wherein the first upper contacts have a zigzag shape in a first oblique direction relative to both the first and second directions.

2. The electronic device according to claim 1, wherein the first upper contacts include a particular upper contact disposed in a side of an $N_{th}$ gate in the second direction overlaps with an $(N-1)_{th}$ or $(N+1)_{th}$ active region in the first direction, where N is a natural number.

3. The electronic device according to claim 2, wherein when the N is an odd number, the particular upper contact disposed in a side of the $N_{th}$ gate in the second direction overlaps with the $(N+1)_{th}$ active region in the first direction, and when the N is an even number, the particular upper contact disposed in the side of the Nth gate in the second direction overlaps with the $(N-1)_{th}$ active region in the first direction.

4. The electronic device according to claim 2, wherein a maxim value of the N depends on the number of the active regions.

5. The electronic device according to claim 1, wherein one of the first upper contacts has a contact area with a different size from that of one of the second upper contacts.

6. The electronic device according to claim 1, wherein each of the first upper contacts is coupled to a corresponding one of the first interconnection lines at one side of the active region in the first direction, and each of the second upper contacts is coupled to a corresponding one of the second interconnection lines at the other side of the active region in the first direction.

7. The electronic device according to claim 1, wherein the semiconductor memory unit further comprises:
  separation gates, each separation gate disposed between the gates in the second direction, extended in the first direction and crossing the plurality of active regions.

8. The electronic device according to claim 7, wherein one of the separation gate and one of the gates are alternately disposed in the second direction.

9. The electronic device according to claim 8, wherein one of the first upper contacts and one of the second upper contacts are alternately disposed in the first oblique direction.

10. The electronic device according to claim 9, wherein two regions where one of the first upper contacts and one of the second upper contacts are alternately disposed in the first oblique direction are disposed in parallel.

11. The electronic device according to claim 7, wherein one of the separation gate and two of the gates are alternately disposed in the second direction.

12. The electronic device according to claim 11, wherein one of the second upper contacts is disposed between the two of the gates and one of the first upper contacts is disposed between one of the gates and one of the separation gate.

13. The electronic device according to claim 11, wherein two regions where one of the first upper contacts and one of the second upper contacts are alternately disposed in the first oblique direction are disposed in parallel.

14. The electronic device according to claim 1, wherein one of the lower contacts has a bar shape, which is extended to contact with the plurality of active regions in the first direction.

15. The electronic device according to claim 1, wherein the lower contacts are coupled to different groups of active regions, each having 2n number of active regions, where n is a natural number, and the lower contacts have a bar shape, which are extended to contact with all of the active regions within each group in the first direction.

16. The electronic device according to claim 15, wherein one of the second upper contacts and one of the first upper contacts are alternately disposed in a second oblique direction crossing the first oblique direction.

17. The electronic device according to claim 1, further comprising a processor which includes:
  a core unit configured to perform, based on a command inputted from an outside of the processor, an operation corresponding to the command, by using data;
  a cache memory unit configured to store data for performing the operation, data corresponding to a result of performing the operation, or an address of data for which the operation is performed; and
  a bus interface connected between the core unit and the cache memory unit, and configured to transmit data between the core unit and the cache memory unit,
  wherein the semiconductor memory unit that is part of the cache memory unit in the processor.

18. The electronic device according to claim 1, further comprising a processing system which includes:
  a processor configured to decode a command received by the processor and control an operation for information based on a result of decoding the command;
  an auxiliary memory device configured to store a program for decoding the command and the information;
  a main memory device configured to call and store the program and the information from the auxiliary memory device such that the processor can perform the operation using the program and the information when executing the program; and
  an interface device configured to perform communication between at least one of the processor, the auxiliary memory device and the main memory device and the outside,
  wherein the semiconductor memory unit is part of the auxiliary memory device or the main memory device in the processing system.

19. The electronic device according to claim 1, further comprising a data storage system which includes:
  a storage device configured to store data and conserve stored data regardless of power supply;
  a controller configured to control input and output of data to and from the storage device according to a command inputted form an outside;
  a temporary storage device configured to temporarily store data exchanged between the storage device and the outside; and
  an interface configured to perform communication between at least one of the storage device, the controller and the temporary storage device and the outside,
  wherein the semiconductor memory unit is part of the storage device or the temporary storage device in the data storage system.

* * * * *